US012696819B2

(12) United States Patent (10) Patent No.: US 12,696,819 B2
Hori et al. (45) Date of Patent: Jul. 28, 2026

(54) ELECTRONIC DEVICE AND ELECTRONIC DEVICE MANUFACTURING METHOD

(71) Applicant: FUJI ELECTRIC CO., LTD.,
Kawasaki (JP)

(72) Inventors: Motohito Hori, Matsumoto-city (JP);
Yoshinari Ikeda, Matsumoto-city (JP)

(73) Assignee: FUJI ELECTRIC CO., LTD.,
Kawasaki (JP)

( * ) Notice: Subject to any disclaimer, the term of this
patent is extended or adjusted under 35
U.S.C. 154(b) by 274 days.

(21) Appl. No.: 18/474,940

(22) Filed: Sep. 26, 2023

(65) Prior Publication Data

US 2024/0178113 A1 May 30, 2024

(30) Foreign Application Priority Data

Nov. 25, 2022 (JP) ................................. 2022-188482

(51) Int. Cl.
| *H10W 90/00* | (2026.01) |
| *H10W 70/05* | (2026.01) |
| *H10W 70/65* | (2026.01) |
| *H10W 40/25* | (2026.01) |
| *H10W 72/00* | (2026.01) |
| *H10W 72/50* | (2026.01) |

(52) U.S. Cl.
CPC ....... *H10W 90/701* (2026.01); *H10W 70/093*
(2026.01); *H10W 70/65* (2026.01); *H10W*
*40/255* (2026.01); *H10W 72/07552* (2026.01);
*H10W 72/527* (2026.01); *H10W 72/5473*
(2026.01); *H10W 72/552* (2026.01); *H10W*
*72/5522* (2026.01); *H10W 72/5524* (2026.01);
*H10W 72/5525* (2026.01); *H10W 72/884*

(2026.01); *H10W 90/00* (2026.01); *H10W*
*90/734* (2026.01); *H10W 90/754* (2026.01)

(58) Field of Classification Search
CPC . H10W 90/701; H10W 70/65; H10W 72/527;
H10W 72/884; H10W 72/07552; H10W
72/851
USPC ......................................................... 174/250
See application file for complete search history.

(56) References Cited

U.S. PATENT DOCUMENTS

| 2017/0372977 | A1 | 12/2017 | Tamai et al. |
| 2019/0006255 | A1 | 1/2019 | Suwa et al. |

FOREIGN PATENT DOCUMENTS

| JP | 2017-228630 A | 12/2017 |
| JP | 2019-117944 A | 7/2019 |
| WO | 2017/119226 A1 | 7/2017 |

*Primary Examiner* — Tremesha W Burns
(74) *Attorney, Agent, or Firm* — Rabin & Berdo, P.C.

(57) ABSTRACT

A positive electrode circuit pattern layer and a negative
electrode circuit pattern layer each have a terminal region
extending in a long-side direction of a rectangular insulating
plate. Thicknesses of a positive electrode bonding region of
a positive electrode terminal and a negative electrode bond-
ing region of a negative electrode terminal are respectively
less than thicknesses of the terminal regions of the positive
electrode circuit pattern layer and the negative electrode
circuit pattern layer. The lengths in the long-side direction of
the positive electrode bonding region of the positive elec-
trode terminal and the negative electrode bonding region of
the negative electrode terminal are respectively greater than
or equal to half the lengths in the long-side direction of the
terminal regions of the positive electrode circuit pattern
layer and negative electrode circuit pattern layer.

11 Claims, 15 Drawing Sheets

ELECTRONIC DEVICE AND ELECTRONIC DEVICE MANUFACTURING METHOD

CROSS-REFERENCE TO RELATED APPLICATION

This application is based upon and claims the benefit of priority of the prior Japanese Patent Application No. 2022-188482, filed on Nov. 25, 2022, the entire contents of which are incorporated herein by reference.

BACKGROUND OF THE INVENTION

1. Field of the Invention

The embodiment discussed herein relates to an electronic device and an electronic device manufacturing method.

2. Background of the Related Art

There is a semiconductor device in which the terminals of positive and negative electrodes are bonded respectively to two patterns facing the outer edge of the semiconductor device via a solder, and these terminals extend outward from the outer edge. See, for example, Japanese Laid-open Patent Publication No. 2019-117944, International Publication Pamphlet No. WO 2017/119226, and Japanese Laid-open Patent Publication No. 2017-228630.

SUMMARY OF THE INVENTION

According to one aspect, there is provided an electronic device, including: a substrate being rectangular in a plan view of the electronic device, the substrate including an insulating plate having a front surface and a rear surface opposite to the front surface, a first circuit pattern layer provided on the front surface of the insulating plate, and a metal plate provided on the rear surface of the insulating plate, the first circuit pattern layer having a first terminal region extending in a long-side direction of the substrate; and a first terminal having a first bonding region bonded to the first terminal region of the first circuit pattern layer via a first bonding material, the first bonding region extending in the long-side direction, wherein a thickness of the first bonding region of the first terminal is less than a thickness of the first terminal region of the first circuit pattern layer, and a length in the long-side direction of the first bonding region of the first terminal is greater than or equal to half a length in the long-side direction of the first terminal region of the first circuit pattern layer.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Hereinafter, an embodiment will be described with reference to the accompanying drawings. In the following description, the terms "front surface" and "top surface" refer to an X-Y plane facing up (in the +Z direction) in a semiconductor device 1 of drawings. Similarly, the term "up" refers to an upward direction (the +Z direction) in the semiconductor device 1 of the drawings. The terms "rear surface" and "bottom surface" refer to an X-Y plane facing down (in the −Z direction) in the semiconductor device 1 of the drawings. Similarly, the term "down" refers to a downward direction (the −Z direction) in the semiconductor device 1 of the drawings. The same directionality applies to other drawings, as appropriate. The term "located above" refers to an upper position (in the +Z direction) in the semiconductor device 1 of the drawings. Similarly, the term "located below" refers to a lower position (in the −Z direction) in the semiconductor device 1 of the drawings. The terms "front surface," "top surface," "up," "rear surface," "bottom surface," "down," and "side surface" are used for convenience to describe relative positional relationships, and do not limit the technical ideas of the embodiment. For example, the terms "up" and "down" are not always related to the vertical directions to the ground. That is, the "up" and "down" directions are not limited to the gravity direction. In addition, in the following description, the term "main component" refers to a component contained at a volume ratio of 80 vol % or more. The expression "being approximately equal" may allow an error range of ±10%. In addition, the expressions "being perpendicular" and "being parallel" may allow an error range of ±10%. Furthermore, in the following, a semiconductor device will be described as an example of an electronic device. A semiconductor device 1 is merely an example of the electronic device, and the electronic device is not limited to the semiconductor device 1.

Figure 1:
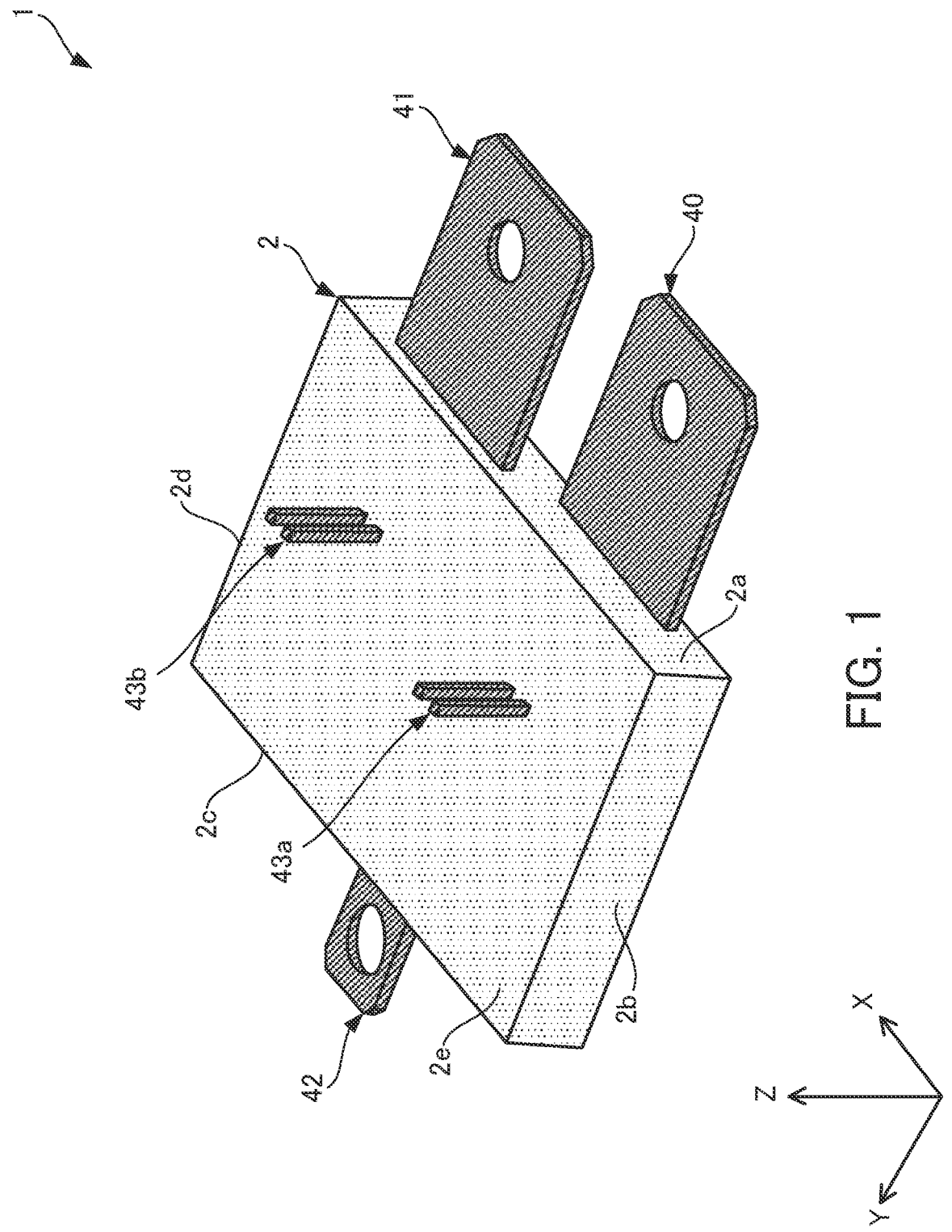
FIG. 1 is a perspective view of a semiconductor device according to one embodiment.
Figure 2:
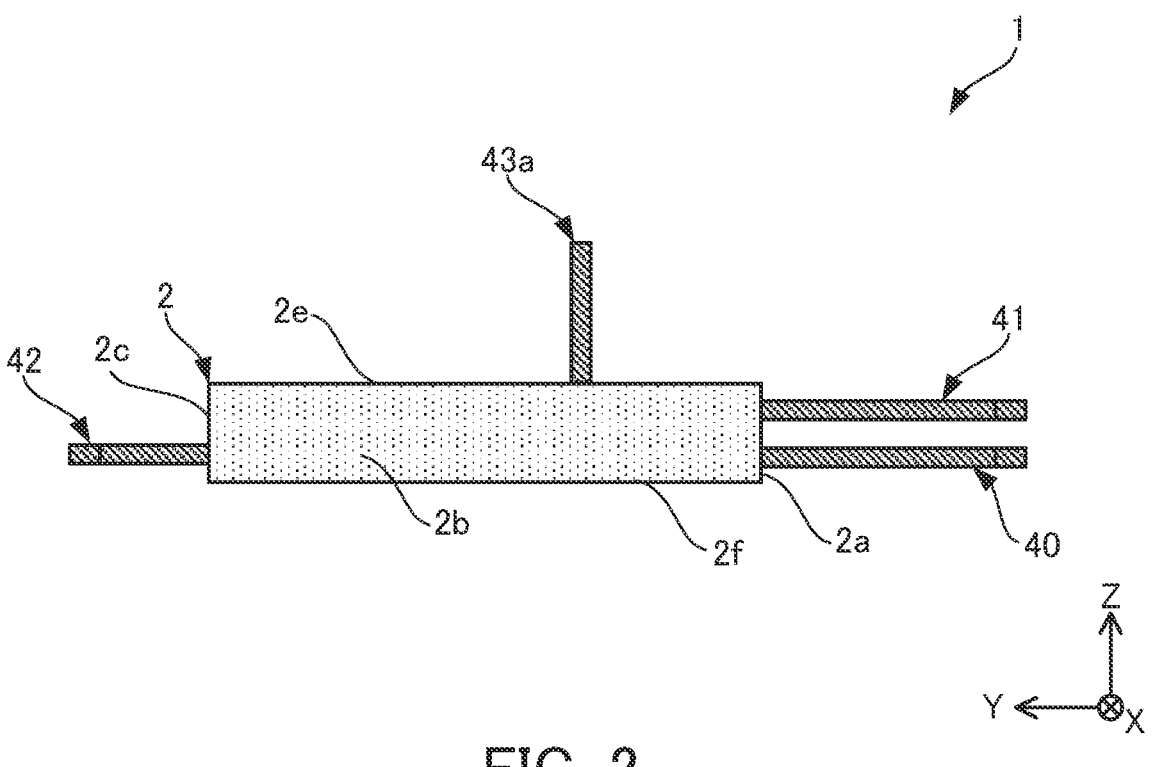
FIG. 2 is a side view (Y-Z plane) of the semiconductor device according to the embodiment.
Figure 3:
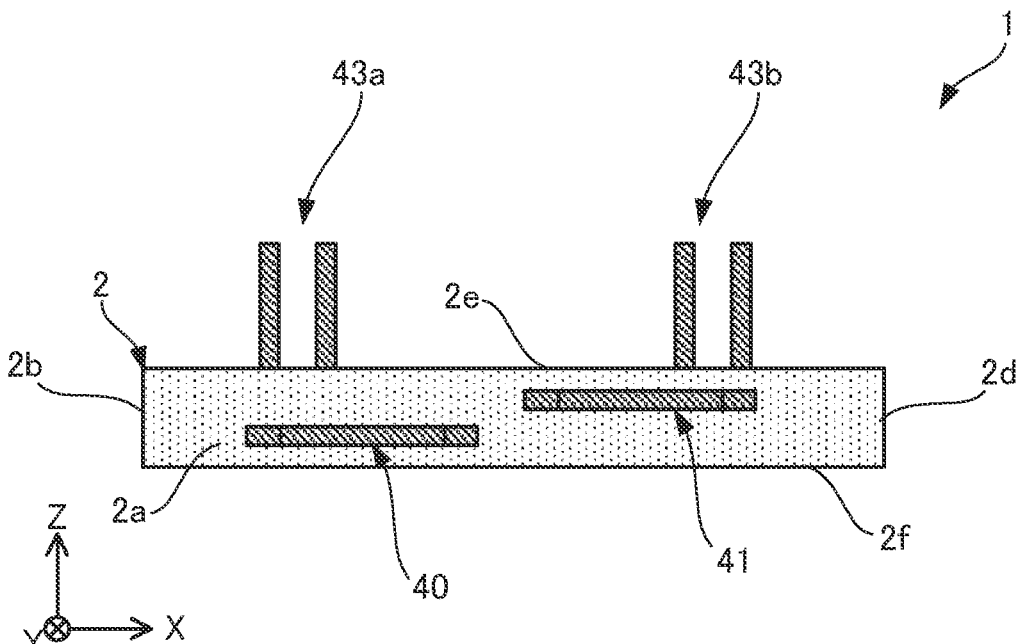
FIG. 3 is a side view (X-Z plane) of the semiconductor device according to the embodiment.
Figure 4:
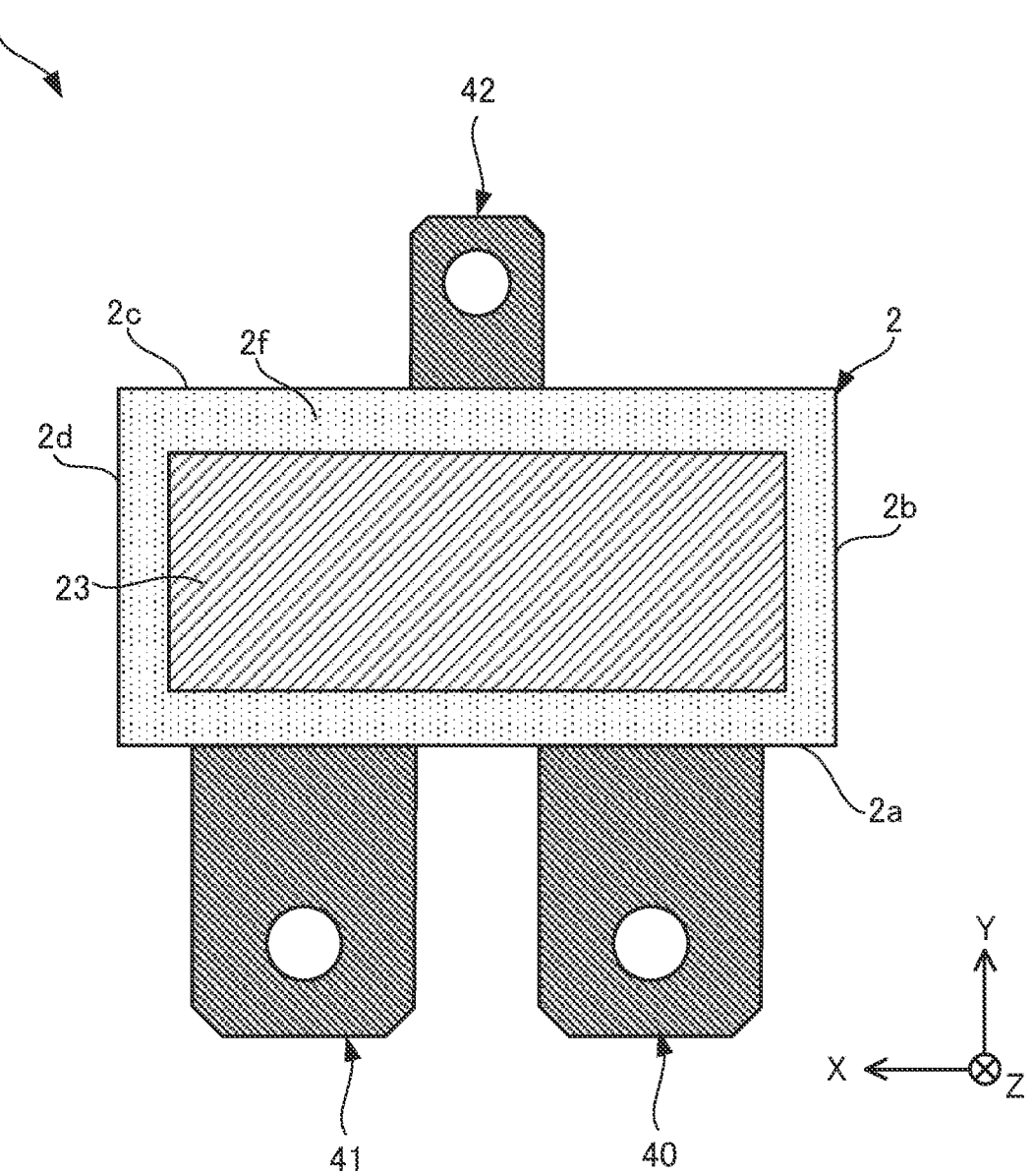
FIG. 4 illustrates the rear surface of the semiconductor device according to the embodiment.

First, the appearance of the semiconductor device 1 according to one embodiment will be described with reference to FIGS. 1 to 4. FIG. 1 is a perspective view of a semiconductor device according to the embodiment. FIG. 2 is a side view (Y-Z plane) of the semiconductor device according to the embodiment. FIG. 3 is a side view (X-Z plane) of the semiconductor device according to the embodiment. FIG. 4 illustrates the rear surface of the semiconductor device according to the embodiment. In this connection, FIG. 2 is a side view of the semiconductor device 1 of FIG. 1 as seen in the +X direction. FIG. 3 is a side view of the semiconductor device 1 of FIG. 1 as seen in the +Y direction. FIG. 2 may be referenced as a side view of the semiconductor device 1 of FIG. 1 as seen in the −X direction. Although the side view of the semiconductor device 1 of FIG. 1 as seen in the −Y direction illustration is omitted, only an output terminal 42 extends from a long side surface 2c.

The semiconductor device 1 includes a semiconductor unit 3 (see FIGS. 6 to 8), which will be described later, and a sealing body 2 sealing the semiconductor unit 3. The sealing body 2 forms a cube and has a top surface 2e and a bottom surface 2f opposite to the top surface 2e, which are rectangular in plan view. The sealing body 2 also has a long side surface 2a, short side surface 2b, long side surface 2c, and short side surface 2d that surround the four sides of each of the top surface 2e and bottom surface 2f in order.

The top surface 2e and bottom surface 2f have approximately the same shape and approximately the same size. The top surface 2e and bottom surface 2f are each substantially entirely smooth. The top surface 2e and bottom surface 2f are approximately parallel to each other. Control terminals 43a and 43b provided in the semiconductor unit 3 each extend vertically upward (in the +Z direction) from the top surface 2e. The rear surface of a metal plate 23 of an insulated circuit substrate 20 that is included in the semiconductor unit 3 and that will be described later is exposed from the bottom surface 2f. The metal plate 23 is approximately flush with the bottom surface 2f.

The long side surfaces 2a and 2c each connect a long side of the top surface 2e to its corresponding long side of the bottom surface 2f. Each connection portion between two adjacent surfaces has approximately the right angle. The connection portions are not limited to having the right angle, but may be rounded or chamfered. A positive electrode terminal 40 and negative electrode terminal 41 provided in the semiconductor unit 3 extend perpendicularly (in the −Y direction) from the long side surface 2a. In this connection, the negative electrode terminal 41 is located closer to the top surface 2e than is the positive electrode terminal 40. The output terminal 42 provided in the semiconductor unit 3 extends perpendicularly (in the +Y direction) from the central portion of the long side surface 2c. In this connection, the output terminal 42 is located at approximately the same height as the positive electrode terminal 40.

The short side surfaces 2b and 2d each connect a short side of the top surface 2e to its corresponding short side of the bottom surface 2f. In addition, the short side surfaces 2b and 2d each connect a side of the long side surface 2a to its facing side of the long side surface 2c (along the circumference direction of the sealing body 2). Each connection portion between two adjacent surfaces has approximately the right angle. The connection portions are not limited to having the right angle, but may be rounded or chamfered.

The above-described sealing body 2 is made of a thermosetting resin as a main component. Examples of the thermosetting resin include an epoxy resin, a phenolic resin, and a maleimide resin. In addition, the thermosetting resin may include a filler. Examples of the filler include silicon oxide, aluminum oxide, boron nitride, and aluminum nitride.

Figure 5:
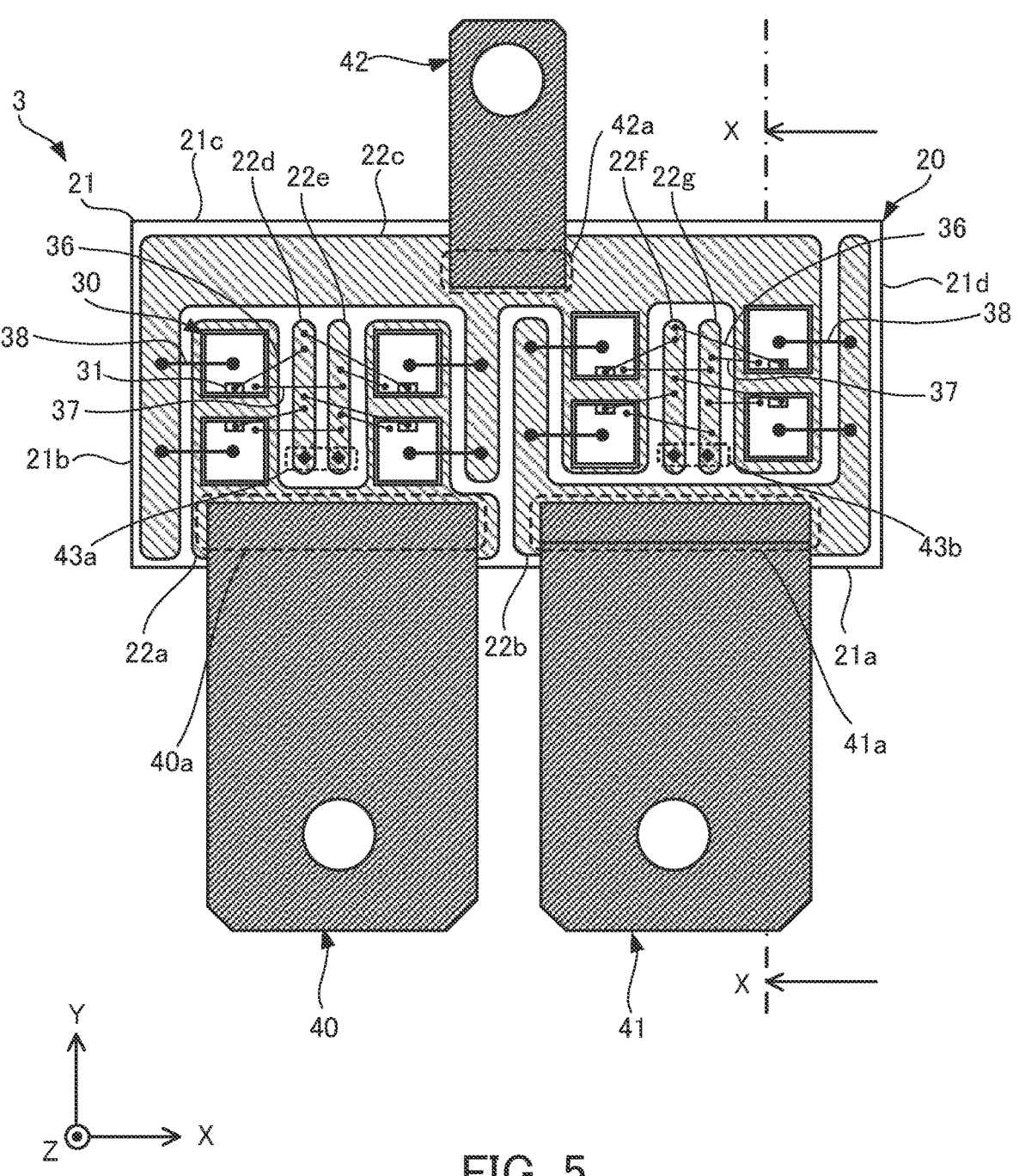
FIG. 5 is a plan view of a semiconductor unit included in the semiconductor device according to the embodiment.
Figure 6:
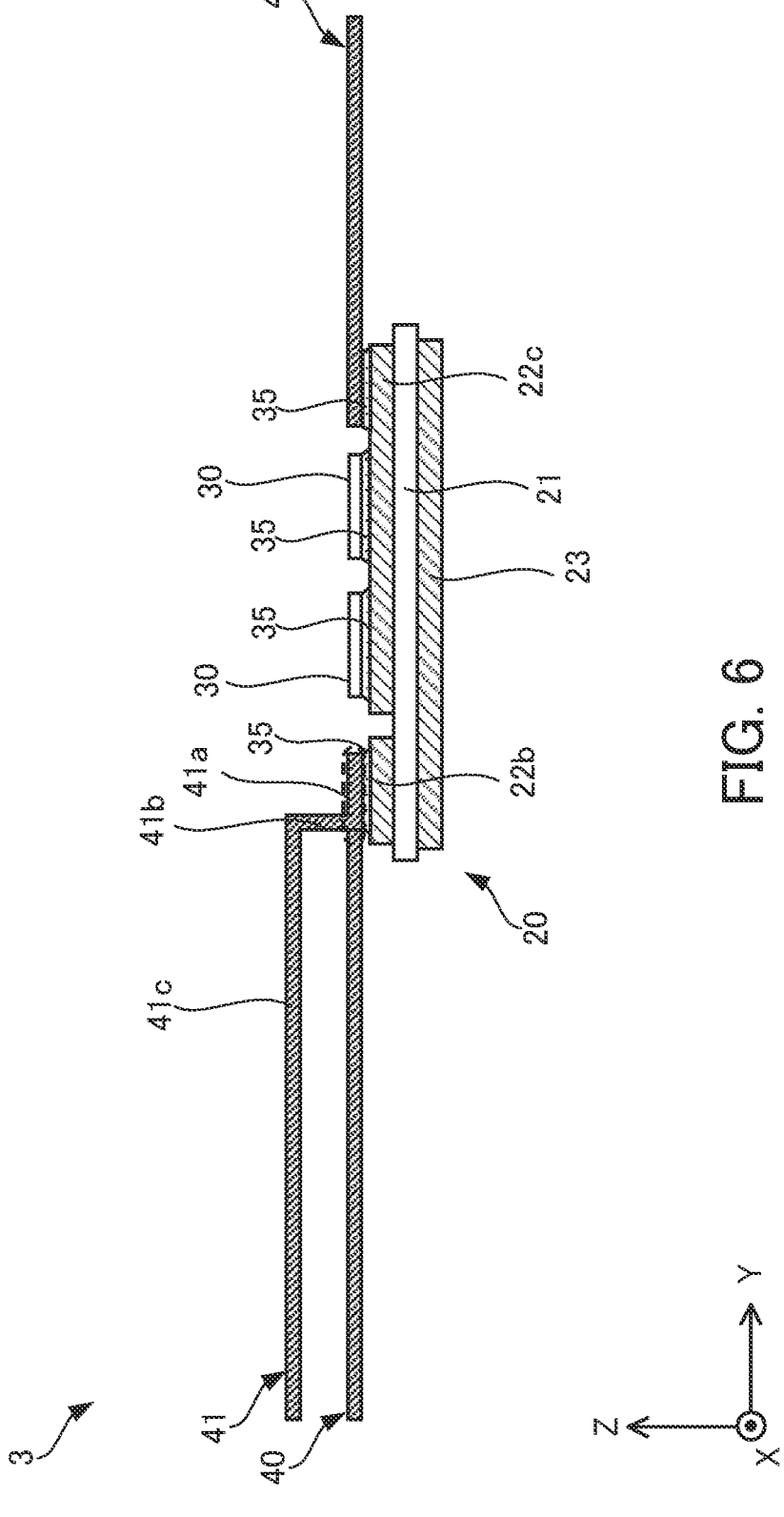
FIG. 6 is a sectional view of the semiconductor unit included in the semiconductor device according to the embodiment.
Figure 7:
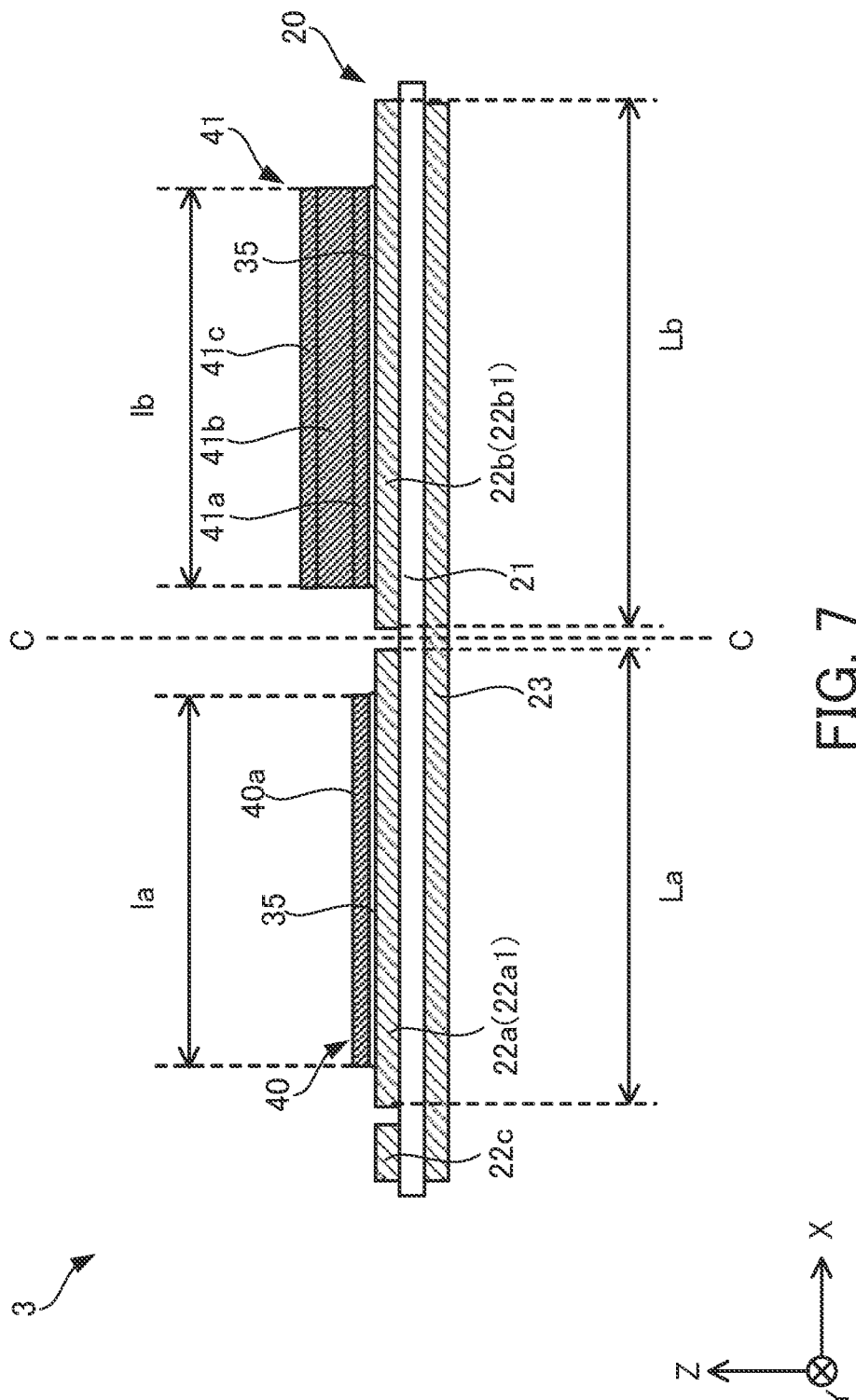
FIG. 7 is a side view (X-Z plane) of the semiconductor unit included in the semiconductor device according to the embodiment.
Figure 8:
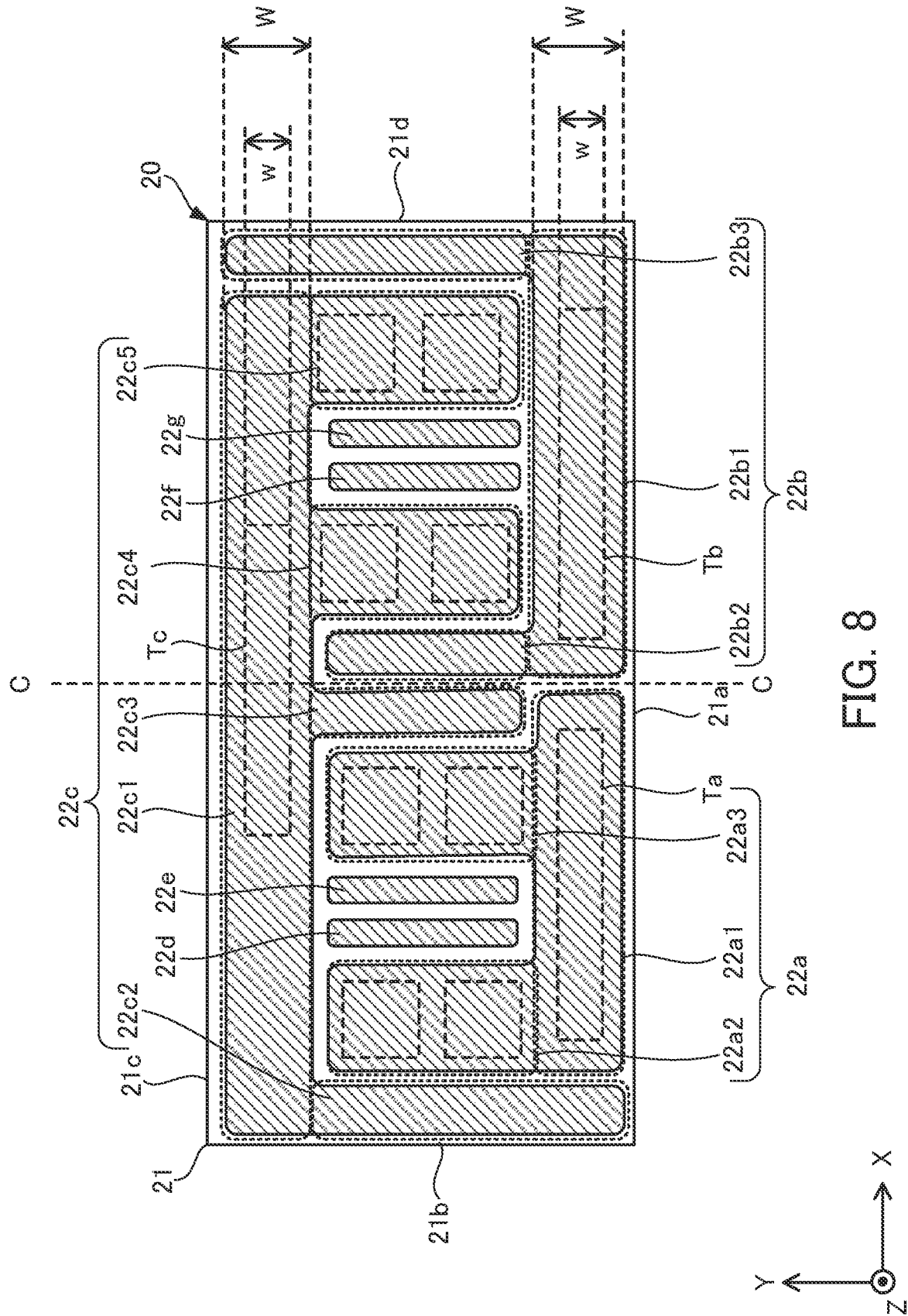
FIG. 8 is a plan view of an insulated circuit substrate included in the semiconductor device according to the embodiment.

The following describes the semiconductor unit 3 with reference to FIGS. 5 to 8. FIG. 5 is a plan view of the semiconductor unit included in the semiconductor device according to the embodiment. FIG. 6 is a sectional view of the semiconductor unit included in the semiconductor device according to the embodiment. FIG. 7 is a side view (X-Z plane) of the semiconductor unit included in the semiconductor device according to the embodiment. FIG. 8 is a plan view of an insulated circuit substrate included in the semiconductor device according to the embodiment. In this connection, FIG. 6 is a sectional view taken along the dashed-dotted line X-X of FIG. 5. FIG. 7 is a side view of the semiconductor unit 3 of FIG. 5 as seen in the +Y direction. In addition, the illustration of the control terminals 43a and 43b and various wires is omitted in FIGS. 6 and 7.

The semiconductor unit 3 includes the insulated circuit substrate 20, semiconductor chips 30, control wires 36, sense wires 37, main current wires 38, the positive electrode terminal 40, the negative electrode terminal 41, the output terminal 42, and the control terminals 43a and 43b.

The insulated circuit substrate 20 is rectangular in plan view. The insulated circuit substrate 20 includes an insulating plate 21, a plurality of circuit pattern layers formed on the front surface of the insulating plate 21, and a metal plate 23 formed on the rear surface of the insulating plate 21. The plurality of circuit pattern layers include a positive electrode circuit pattern layer 22a, a negative electrode circuit pattern layer 22b, an output circuit pattern layer 22c, control circuit pattern layers 22d and 22f, and sense circuit pattern layers 22e and 22g. In the following description, these may be referred to as circuit pattern layers without distinction among them. In plan view, the outline of the plurality of circuit pattern layers and the outline of the metal plate 23 are smaller than the outline of the insulating plate 21, and the plurality of circuit pattern layers and the metal plate 23 are formed inside the insulating plate 21. In this connection, the shapes, quantity, and sizes of the plurality of circuit pattern layers are illustrated just as an example.

The insulating plate 21 is rectangular in plan view. In addition, the corners of the insulating plate 21 may be chamfered. For example, the corners may be chamfered or rounded. The insulating plate 21 is surrounded on its four sides by a long side 21a, a short side 21b, a long side 21c, and a short side 21d, which form the outer periphery of the insulating plate 21. This insulating plate 21 is made of ceramics with high thermal conductivity. The ceramics may contain, for example, aluminum oxide, aluminum nitride, or silicon nitride as a main component. Furthermore, the thickness of the insulating plate 21 is in the range of, for example, 0.2 mm to 0.4 mm, inclusive, and is here approximately 0.32 mm.

The metal plate 23 is rectangular in plan view. The corners of the metal plate 23 may be chamfered or rounded, for example. The metal plate 23 is smaller in size than the insulating plate 21 and is formed on the entire rear surface of the insulating plate 21 except the edge portion thereof. The metal plate 23 is made of a metal with high thermal conductivity as a main component. Examples of the metal here include copper, aluminum, and an alloy containing at least one of these. In addition, the thickness of the metal plate 23 is in the range of 0.5 mm to 0.7 mm, inclusive, and is here approximately 0.6 mm. Plating may be performed on the metal plate in order to improve its corrosion resistance. Examples of the plating material used here include nickel, a nickel-phosphorus alloy, and a nickel-boron alloy.

As described earlier, the plurality of circuit pattern layers include the positive electrode circuit pattern layer 22a, negative electrode circuit pattern layer 22b, output circuit pattern layer 22c, control circuit pattern layers 22d and 22f, and sense circuit pattern layers 22e and 22g. The plurality of circuit pattern layers are formed on the entire surface of the insulating plate 21 except the edge portion thereof. Preferably, in plan view, the edge portions of the plurality of the circuit pattern layers that face the outer periphery of the insulating plate 21 overlap the edge portion of the metal plate 23 that faces the outer periphery of the insulating plate 21.

The thicknesses of the plurality of circuit pattern layers are in the range of, for example, 0.5 mm to 0.7 mm, inclusive, and are here approximately 0.6 mm. That is, the thicknesses of the plurality of circuit pattern layers are approximately equal to the thickness of the metal plate 23. The plurality of circuit pattern layers are made of a metal with high electrical conductivity. Examples of the metal here include copper, aluminum, and an alloy containing at least one of these. In addition, plating may be performed on the surfaces of the plurality of circuit pattern layers in order to improve their corrosion resistance. Examples of the plating material used here include nickel, a nickel-phosphorus alloy, and a nickel-boron alloy.

In plan view, the positive electrode circuit pattern layer 22a included in the plurality of circuit pattern layers has an "F" shape and is formed adjacent to the long side 21a of the insulating plate 21. The positive electrode circuit pattern layer 22a includes a terminal region 22a1 and chip regions 22a2 and 22a3.

The terminal region 22a1 is rectangular in plan view. The terminal region 22a1 is formed on the front surface of the insulating plate 21 so as to extend in parallel to the long side 21a (in the long-side direction). The +X-side end portion of the terminal region 22a1 is a predetermined distance away from the center line C of the front surface of the insulating plate 21 toward the short side 21b. The center line C passes through the centers of the long sides 21a and 21c in parallel to the short sides 21b and 21d. The −X-side end portion of the terminal region 22a1 and the short side 21b have a gap therebetween. The terminal region 22a1 faces the long side 21a. A dotted region (attachment region Ta) indicated in the terminal region 22a1 is a portion to which the positive electrode terminal 40 is bonded. In this connection, the width W in the ±Y directions of the terminal region 22a1 is greater than the width w in the ±Y directions of the attachment region Ta.

The chip region 22a2 is rectangular in plan view. The chip region 22a2 extends from the −X-side end portion of the terminal region 22a1 toward the long side 21c in parallel to the short sides 21b and 21d (in the short-side direction). The +Y-side end portion of the chip region 22a2 and the long side 21c have a gap therebetween. The −X-side end portion of the chip region 22a2 and the −X-side end portion of the terminal region 22a1 are aligned. Two dotted regions indicated in the chip region 22a2 are portions to which semiconductor chips 30 are bonded. In this connection, the width in the ±X directions of the chip region 22a2 is greater than the width W of the terminal region 22al.

The chip region 22a3 is rectangular in plan view. The chip region 22a3 extends toward the long side 21c in parallel to the short sides 21b and 21d from a position of the terminal region 22a1 located a predetermined distance away from the +X-side end portion of the terminal region 22a1 in the −X direction. The +Y-side end portion of the chip region 22a3 and the long side 21c have a gap therebetween. The +Y-side end portions of the chip regions 22a2 and 22a3 are aligned. The +X-side end portion of the chip region 22a3 and the center line C have a gap therebetween. The +X-side end portion of the chip region 22a2 and the −X-side end portion of the chip region 22a3 have a gap therebetween. Two dotted regions indicated in the chip region 22a3 are portions to which semiconductor chips 30 are bonded. In this connection, the width in the ±X directions of the chip region 22a3 is approximately equal to the width in the ±X directions of the chip region 22a2, and is greater than the width W of the terminal region 22al. In addition, the width of the gap between the +X-side end portion of the chip region 22a2 and the −X-side end portion of the chip region 22a3 is approximately equal to the widths in the ±X directions of the chip regions 22a2 and 22a3.

The negative electrode circuit pattern layer 22b included in the plurality of circuit pattern layers has a "J" shape in plan view and is formed adjacent to the long side 21a of the insulating plate 21. The negative electrode circuit pattern layer 22b includes a terminal region 22b1 and wiring regions 22b2 and 22b3.

The terminal region 22b1 is rectangular in plan view. The terminal region 22b1 is formed on the front surface of the insulating plate 21 so as to extend in parallel to the long side 21a (in the long-side direction). The −X-side end portion of the terminal region 22b1 is a predetermined distance away from the center line C of the front surface of the insulating plate 21 toward the short side 21d. In addition, the −X-side end portion of the terminal region 22b1 and the +X-side end portion of the terminal region 22a1 are line symmetrical with respect to the center line C. The terminal region 22b1 faces the long side 21a. A dotted region (attachment region Tb) indicated in the terminal region 22b1 is a portion to which the negative electrode terminal 41 is bonded. In this connection, the width W in the ±Y directions of the terminal region 22b1 is greater than the width w in the ±Y directions of the attachment region Tb.

The wiring region 22b2 is rectangular in plan view. The wiring region 22b2 extends from the −X-side end portion of the terminal region 22b1 toward the long side 21c in parallel to the short sides 21b and 21d (in the short-side direction). The +Y-side end portion of the wiring region 22b2 and the long side 21c have a gap therebetween. The −X-side end portion of the wiring region 22b2 and the −X-side end portion of the terminal region 22b1 are aligned. In this connection, the width in the ±X directions of the wiring region 22b2 is less than the width W of the terminal region 22bl.

The wiring region 22b3 is rectangular in plan view. The wiring region 22b3 extends from the +X-side end portion of the terminal region 22b1 toward the long side 21c in parallel to the short sides 21b and 21d (in the short-side direction). The +Y-side end portion of the wiring region 22b3 extends up to, but not beyond, the edge portion of the insulating plate 21 adjacent to the long side 21c. In addition, the +X-side end portion of the wiring region 22b3 faces the short side 21d. The +X-side end portion of the wiring region 22b3 and the +X-side end portion of the terminal region 22b1 are aligned.

In this connection, the width in the ±X directions of the wiring region 22b3 is approximately equal to the width in the ±X directions of the wiring region 22b2, and is less than the width W of the terminal region 22bl.

The output circuit pattern layer 22c included in the plurality of circuit pattern layers has a comb tooth shape in plan view and is formed adjacent to the long side 21c of the insulating plate 21. The output circuit pattern layer 22c includes a terminal region 22c1, wiring regions 22c2 and 22c3, and chip regions 22c4 and 22c5.

The terminal region 22c1 is rectangular in plan view. The terminal region 22c1 is formed on the front surface of the insulating plate 21 so as to extend in parallel to the long side 21c (in the long-side direction). The –X-side end portion of the terminal region 22c1 faces the short side 21b of the front surface of the insulating plate 21. In addition, the +X-side end portion of the terminal region 22c1 is spaced away from the short side 21d. The terminal region 22c1 also faces the long side 21c. A dotted region (attachment region Tc) indicated in the terminal region 22c1 is a portion to which the output terminal 42 is bonded. In this connection, the width W in the ±Y directions of the terminal region 22c1 is approximately equal to the width W in the ±Y directions of the terminal region 22a1 and is greater than the width w in the ±Y directions of the attachment region Tc.

The wiring region 22c2 is rectangular in plan view. The wiring region 22c2 extends from the –X-side end portion of the terminal region 22c1 toward the long side 21a in parallel to the short sides 21b and 21d (in the short-side direction). The –Y-side end portion of the wiring region 22c2 faces the long side 21a. The –X-side end portion of the wiring region 22c2 and the –X-side end portion of the terminal region 22c1 are aligned. In this connection, the width in the ±X directions of the wiring region 22c2 is less than the width W of the terminal region 22c1.

The wiring region 22c3 is rectangular in plan view. The wiring region 22c3 extends from the terminal region 22c1 toward the long side 21a in parallel to the short sides 21b and 21d (in the short-side direction) between the chip region 22a3 and the wiring region 22b2. The –Y-side end portion of the wiring region 22c3 faces the terminal region 22al. The width in the ±X directions of the wiring region 22c3 corresponds to the gap between the chip region 22a3 and the wiring region 22b2 and is approximately equal to the width in the ±X directions of the wiring region 22c2.

The chip region 22c4 is rectangular in plan view. The chip region 22c4 extends from the terminal region 22c1 toward the long side 21a in parallel to the short sides 21b and 21d (in the short-side direction) between the wiring region 22b2 and the control circuit pattern layer 22f, which will be described later. The –Y-side end portion of the chip region 22c4 faces the terminal region 22b1. Two dotted regions indicated in the chip region 22c4 are portions to which semiconductor chips 30 are bonded. In this connection, the width in the ±X directions of the chip region 22c4 is greater than the width W of the terminal region 22c1.

The chip region 22c5 is rectangular in plan view. The chip region 22c5 extends from the +X-side end portion of the terminal region 22c1 toward the long side 21a in parallel to the short sides 21b and 21d (in the short-side direction) between the wiring region 22b3 and the sense circuit pattern layer 22g, which will be described later. The –Y-side end portion of the chip region 22c5 faces the terminal region 22b1. The –Y-side end portions of the chip regions 22c4 and 22c5 and wiring region 22c3 are aligned. In addition, the +X-side end portion of the chip region 22c5 and the +X-side end portion of the terminal region 22c1 are aligned. Two dotted regions indicated in the chip region 22c5 are portions to which semiconductor chips 30 are bonded. In this connection, the width in the ±X directions of the chip region 22c5 is approximately equal to the width in the ±X directions of the chip region 22c4, and is greater than the width W of the terminal region 22c1. In addition, the width of the gap between the –X-side end portion of the chip region 22c5 and the +X-side end portion of the chip region 22c4 is approximately equal to the widths in the ±X directions of the chip regions 22c4 and 22c5.

The control circuit pattern layer 22d and sense circuit pattern layer 22e included in the plurality of circuit pattern layers are rectangular in plan view, and are formed in the region surrounded by the positive electrode circuit pattern layer 22a and the terminal region 22c1 of the output circuit pattern layer 22c so as to extend in parallel to the short sides 21b and 21d (in the short-side direction). The widths in the ±X directions of the control circuit pattern layer 22d and sense circuit pattern layer 22e are less than the width in the ±X directions of the wiring region 22c2.

The control circuit pattern layer 22f and sense circuit pattern layer 22g included in the plurality of circuit pattern layers are rectangular in plan view, and are formed in the region surrounded by the terminal region 22b1 of the negative electrode circuit pattern layer 22b and the terminal region 22c1 and chip regions 22c4 and 22c5 of the output circuit pattern layer 22c so as to extend in parallel to the short sides 21b and 21d (in the short-side direction). The widths in the ±X directions of the control circuit pattern layer 22f and sense circuit pattern layer 22g are less than the width in the ±X directions of the wiring region 22c2.

As the insulated circuit substrate 20 configured as above, a direct copper bonding (DCB) substrate or an active metal brazed (AMB) substrate may be used, for example. The insulated circuit substrate 20 transfers heat generated by the semiconductor chips 30 through the positive electrode circuit pattern layer 22a, negative electrode circuit pattern layer 22b, insulating plate 21, and metal plate 23 to the rear surface of the insulated circuit substrate 20, thereby dissipating the heat.

The semiconductor chips 30 are power devices made of silicon carbide. One example of this type of power devices is a power metal-oxide-semiconductor field-effect transistor (MOSFET). The semiconductor chips 30 of this type each have a drain electrode serving as an input electrode on the rear surface thereof, and have a gate electrode serving as a control electrode 31 and a source electrode serving as an output electrode on the front surface thereof. Here, each semiconductor chip 30 has the control electrode 31 at the central portion on one side thereof, as an example.

Alternatively, the semiconductor chips 30 may be power devices made of silicon. One example of this type of power devices is a reverse conducting-insulated gate bipolar transistor (RC-IGBT). An RC-IGBT integrates an IGBT serving as a switching element and a free-wheeling diode (FWD) serving as a diode element on one chip. For example, the semiconductor chips 30 of this type each have a collector electrode serving as an input electrode on the rear surface thereof and have a gate electrode serving as a control electrode and an emitter electrode serving as an output electrode on the front surface thereof.

In this embodiment, the semiconductor chips 30 are disposed in plurality on the positive electrode circuit pattern layer 22a and output circuit pattern layer 22c via a bonding material 35. In the embodiment, two semiconductor chips 30 are disposed along the short sides 21b and 21d in each of the chip regions 22a2 and 22a3 of the positive electrode circuit pattern layer 22a and the chip regions 22c4 and 22c5 of the output circuit pattern layer 22c, as an example. In addition, in the embodiment, the two semiconductor chips 30 disposed in each of the chip regions 22a2 and 22a3 of the positive electrode circuit pattern layer 22a and the chip regions 22c4 and 22c5 of the output circuit pattern layer 22c are adjacent to each other such that their control electrodes 31 face each other.

The positive electrode terminal 40, negative electrode terminal 41, output terminal 42, and control terminals 43a and 43b are made of a metal with high electrical conductivity. Examples of the metal here include copper, a copper alloy, aluminum, and an aluminum alloy. Plating may be performed on the positive electrode terminal 40, negative electrode terminal 41, output terminal 42, and control terminals 43a and 43b in order to improve their corrosion resistance. Examples of the plating material used here include nickel, a nickel-phosphorus alloy, and a nickel-boron alloy.

The thicknesses of the positive electrode terminal 40, negative electrode terminal 41, and output terminal 42 may be less than those of the positive electrode circuit pattern layer 22a, negative electrode circuit pattern layer 22b, and output circuit pattern layer 22c, respectively. The thicknesses of the positive electrode terminal 40, negative electrode terminal 41, and output terminal 42 are in the range of, for example, 0.4 mm to 0.6 mm, inclusive, and are here approximately 0.5 mm. In addition, the total thickness of the positive electrode terminal 40 and positive electrode circuit pattern layer 22a, the total thickness of the negative electrode terminal 41 and negative electrode circuit pattern layer 22b, and the total thickness of the output terminal 42 and output circuit pattern layer 22c may be greater than the thickness of the metal plate 23.

The positive electrode terminal 40 has a flat plate shape. A positive electrode bonding region 40a that is the inner end portion of the positive electrode terminal 40 is bonded to the attachment region Ta of the terminal region 22a1 of the positive electrode circuit pattern layer 22a via the bonding material 35. The outer end portion of the positive electrode terminal 40 extends perpendicularly (in the −Y direction) from the terminal region 22a1 of the positive electrode circuit pattern layer 22a. In this connection, the corners of the outer end portion of the positive electrode terminal 40 may be rounded or chamfered. In addition, a through hole may be formed in the outer end portion of the positive electrode terminal 40. A bus bar may be attached via such a through hole. In addition, the positive electrode terminal 40 as a whole has an approximately uniform thickness and uniform width (in the ±X directions in FIG. 5).

In addition, the thickness of the positive electrode terminal 40 may be less than that of the positive electrode circuit pattern layer 22a. The thickness of the positive electrode terminal 40 is in the range of, for example, 0.4 mm to 0.6 mm, inclusive, and is here approximately 0.5 mm. The width la (in the ±X directions in FIG. 7) of the positive electrode bonding region 40a of the positive electrode terminal 40 may be greater than or equal to half the width La in the ±X directions of the terminal region 22a1 of the positive electrode circuit pattern layer 22a.

The negative electrode terminal 41 includes a negative electrode bonding region 41a, a linkage region 41b, and a wiring region 41c. Each of the negative electrode bonding region 41a, linkage region 41b, and wiring region 41c has a flat plate shape. The negative electrode terminal 41 as a whole has an approximately uniform thickness and uniform width (in the ±X directions in FIG. 5). The negative electrode bonding region 41a that is the inner end portion of the negative electrode terminal 41 is bonded via the bonding material 35 to the attachment region Tb of the terminal region 22b1 of the negative electrode circuit pattern layer 22b. The linkage region 41b connects to the end portion (in the −Y direction in FIG. 5) of the negative electrode bonding region 41a and extends vertically upward (in the +Z direction) therefrom. The wiring region 41c connects to the linkage region 41b and extends perpendicularly (in the −Y direction) from the terminal region 22b1 of the negative electrode circuit pattern layer 22b. Thus, the wiring region 41c of the negative electrode terminal 41 is spaced apart from the front surface of the insulated circuit substrate 20 by a distance equal to the height of the linkage region 41b in the +Z direction. In addition, the corners of the outer end portion of the wiring region 41c of the negative electrode terminal 41 may be rounded or chamfered. In addition, a through hole may be formed in the outer end portion of the negative electrode terminal 41. A bus bar may be attached via such a through hole.

The thickness of the negative electrode terminal 41 may be less than that of the negative electrode circuit pattern layer 22b. The thickness of the negative electrode terminal 41 is in the range of, for example, 0.4 mm to 0.6 mm, inclusive, and is here approximately 0.5 mm. The width lb (in the ±X directions in FIG. 7) of the negative electrode bonding region 41a of the negative electrode terminal 41 may be greater than or equal to half the width Lb in the ±X directions of the terminal region 22b1 of the negative electrode circuit pattern layer 22b.

The output terminal 42 has a flat plate shape. An output bonding region 42a that is the inner end portion of the output terminal 42 is bonded via the bonding material 35 to the attachment region Tc of the terminal region 22c1 of the output circuit pattern layer 22c. The outer end portion of the output terminal 42 extends perpendicularly (in the +Y direction) from the terminal region 22c1 of the output circuit pattern layer 22c. In this connection, the corners of the outer end portion of the output terminal 42 may be rounded or chamfered. In addition, a through hole may be formed in the outer end portion of the output terminal 42. A bus bar may be attached via such a through hole. The output terminal 42 as a whole has an approximately uniform thickness and uniform width (in the ±X directions in FIG. 5).

In this connection, the thickness of the bonding material 35 for bonding the positive electrode terminal 40, negative electrode terminal 41, and output terminal 42 to the positive electrode circuit pattern layer 22a, negative electrode circuit pattern layer 22b, and output circuit pattern layer 22c is in the range of, for example, 0.08 mm to 0.12 mm, inclusive, and is here approximately 0.1 mm.

The control terminals 43a and 43b have a columnar shape. The columnar shape here may have a polygonal, circular, or elliptical shape in cross section. The cross sections of these control terminals 43a and 43b have a diameter (diagonal length) in the range of, for example, 0.7 mm to 1.5 mm, inclusive. The lower end portions of the control terminals 43a are bonded to the end portions of the control circuit pattern layer 22d and sense circuit pattern layer 22e closer to the long side 21a using the bonding material 35 (not illustrated). The upper end portions of the control terminals 43a extend vertically upward (in the +Z direction) from the control circuit pattern layer 22d and sense circuit pattern layer 22e. The lower end portions of the control terminals 43b are bonded to the end portions of the control circuit pattern layer 22f and sense circuit pattern layer 22g closer to the long side 21a using the bonding material 35 (not illustrated). The upper end portions of the control terminals 43*b* extend vertically upward (in the +Z direction) from the control circuit pattern layer 22*f* and sense circuit pattern layer 22*g*.

The control wires 36, sense wires 37, and main current wires 38 are made of a material with high electrical conductivity as a main component. Examples of the material used here include gold, copper, aluminum, and an alloy containing at least one of these. The control wires 36, sense wires 37, and main current wires 38 are preferably made of an aluminum alloy containing a very small amount of silicon. In addition, the diameters of the control wires 36 and sense wires 37 may be less than the diameters of the main current wires 38.

The control wires 36 (provided on the –X side in FIG. 5) each connect the control electrode 31 of a semiconductor chip 30 directly to the control circuit pattern layer 22*d*. The control wires 36 (provided on the +X side in FIG. 5) each connect the control electrode 31 of a semiconductor chip 30 directly to the control circuit pattern layer 22*f*.

The sense wires 37 (provided on the –X side in FIG. 5) each connect the output electrode of a semiconductor chip 30 directly to the sense circuit pattern layer 22*e*. The sense wires 37 (provided on the +X side in FIG. 5) each connect the output electrode of a semiconductor chip 30 directly to the sense circuit pattern layer 22*g*.

The main current wires 38 (on the –X side in FIG. 5) each connect the output electrode of a semiconductor chip 30 directly to the wiring region 22*c*2 or 22*c*3 of the output circuit pattern layer 22*c*. The main current wires 38 (on the +X side in FIG. 5) each connect the output electrode of a semiconductor chip 30 directly to the wiring region 22*b*2 or 22*b*3 of the negative electrode circuit pattern layer 22*b*. The main current wires 38 are provided in parallel to the long sides 21*a* and 21*c*.

Figure 9:
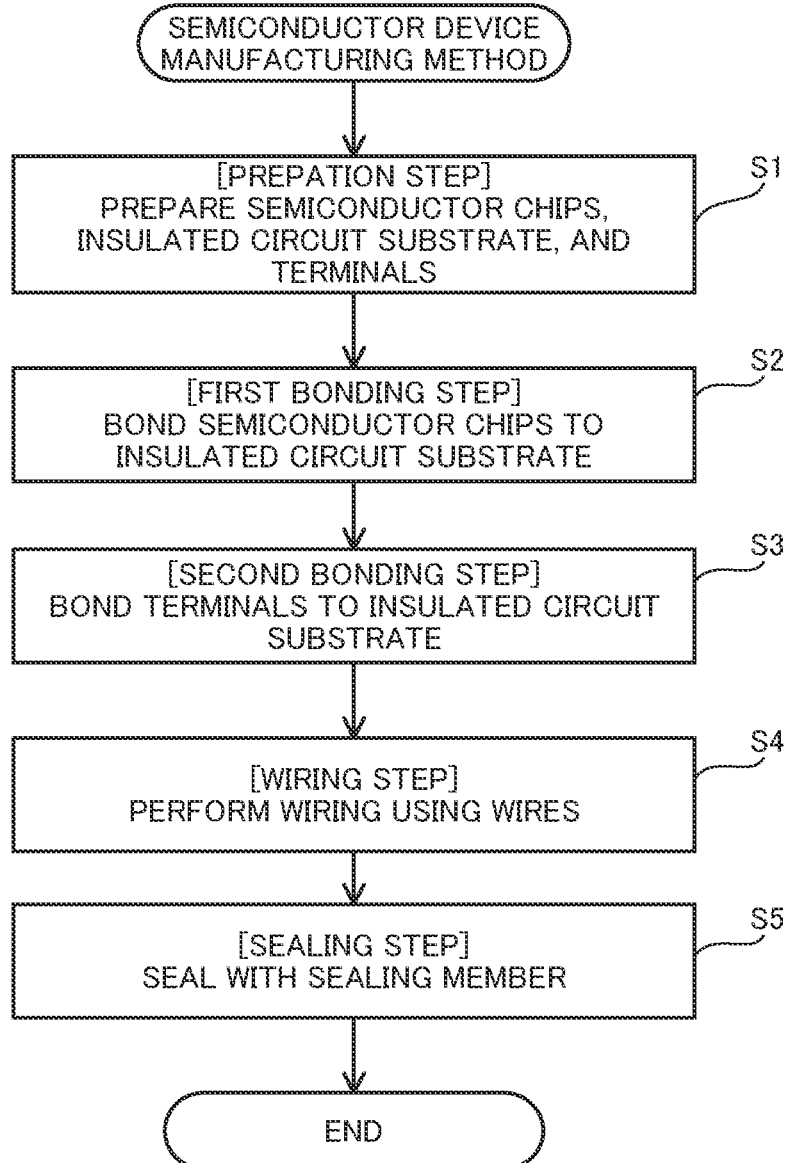
FIG. 9 is a flowchart illustrating a semiconductor device manufacturing method according to the embodiment.
Figures 10A, 10B:
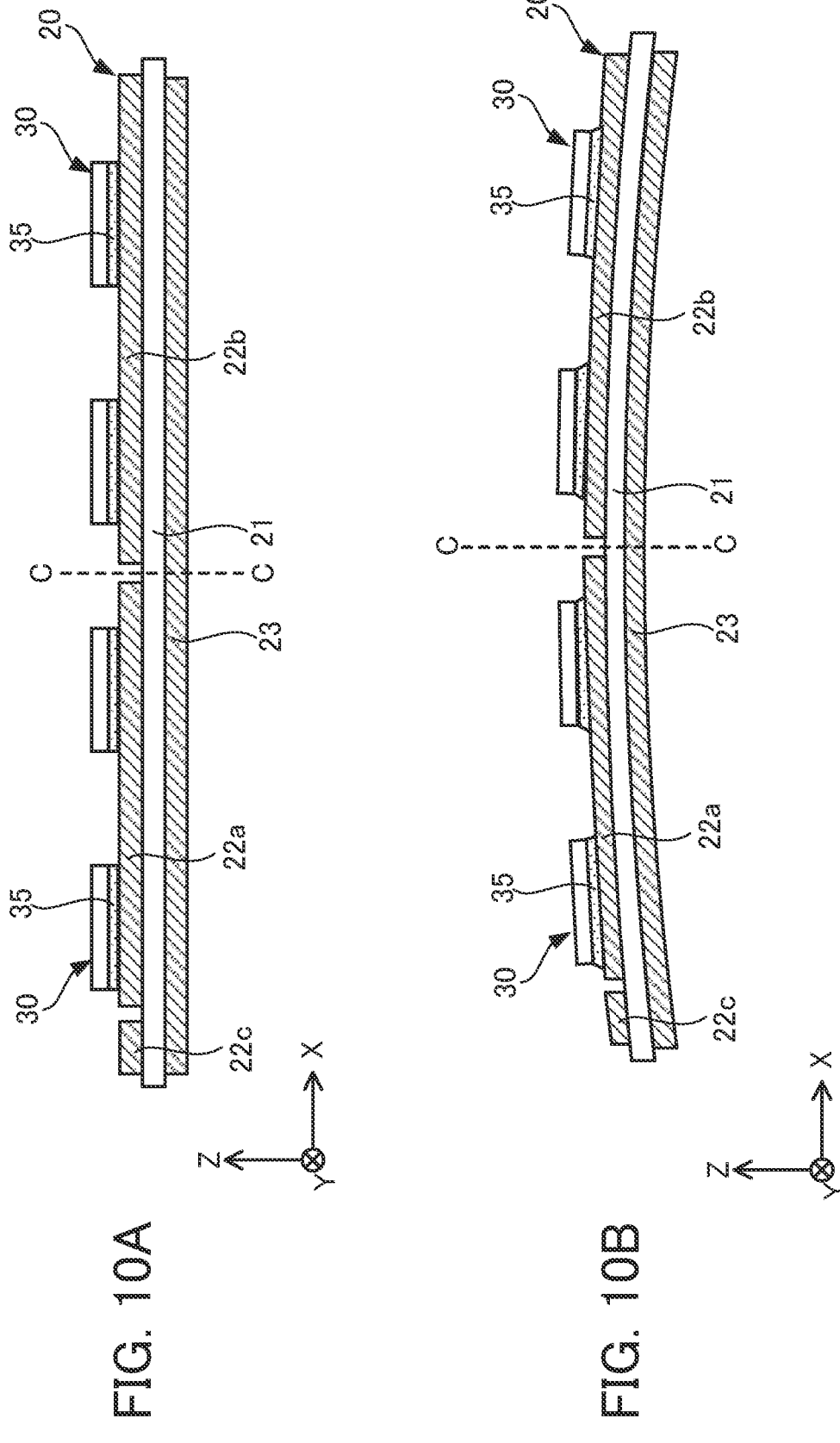
FIGS. 10A and 10B are views for describing a first bonding step included in the semiconductor device manufacturing method according to the embodiment.
Figures 11A, 11B, 11C:
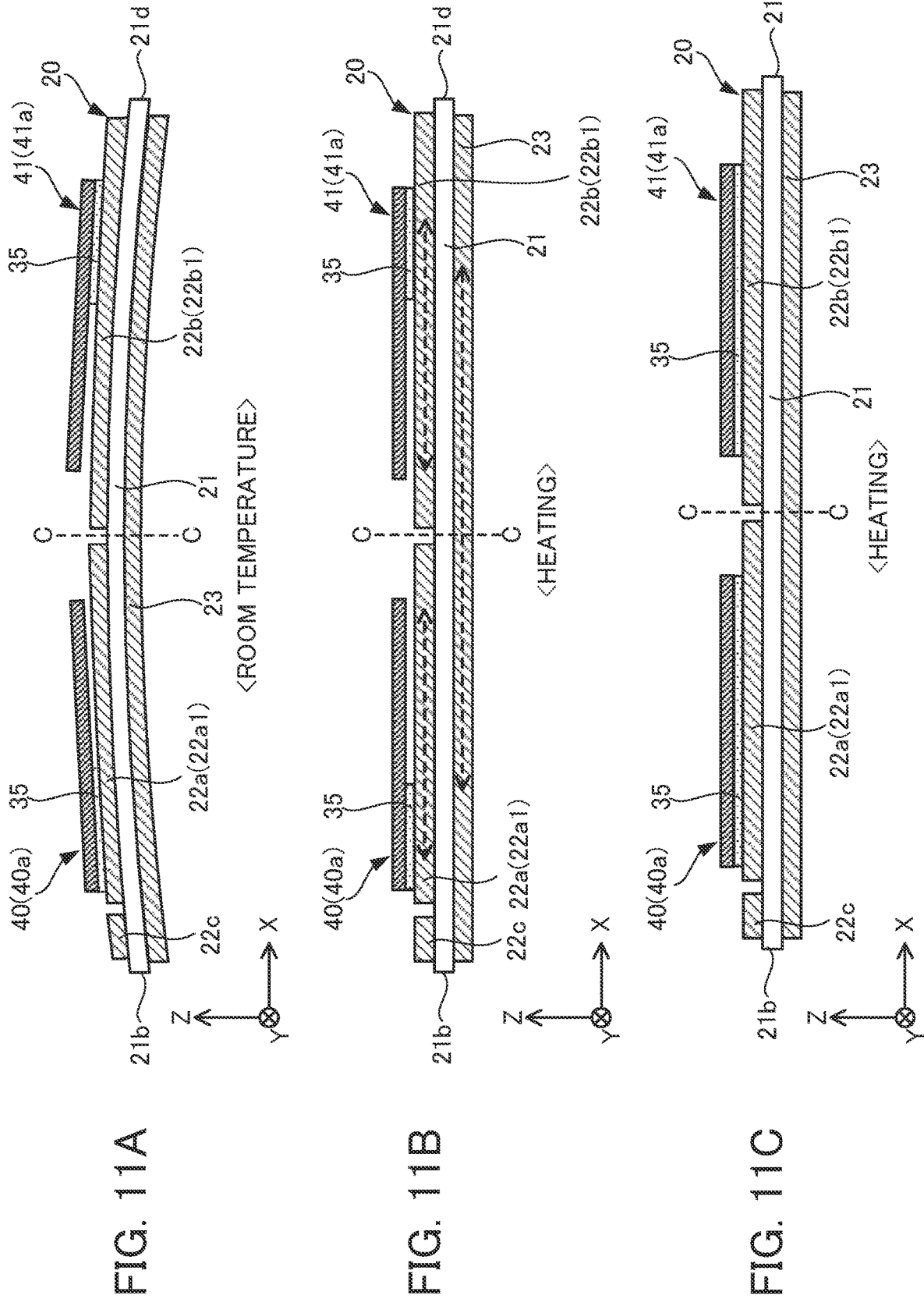
FIGS. 11A to 11C are views for describing a second bonding step (heating time) included in the semiconductor device manufacturing method according to the embodiment.
Figures 12A, 12B:
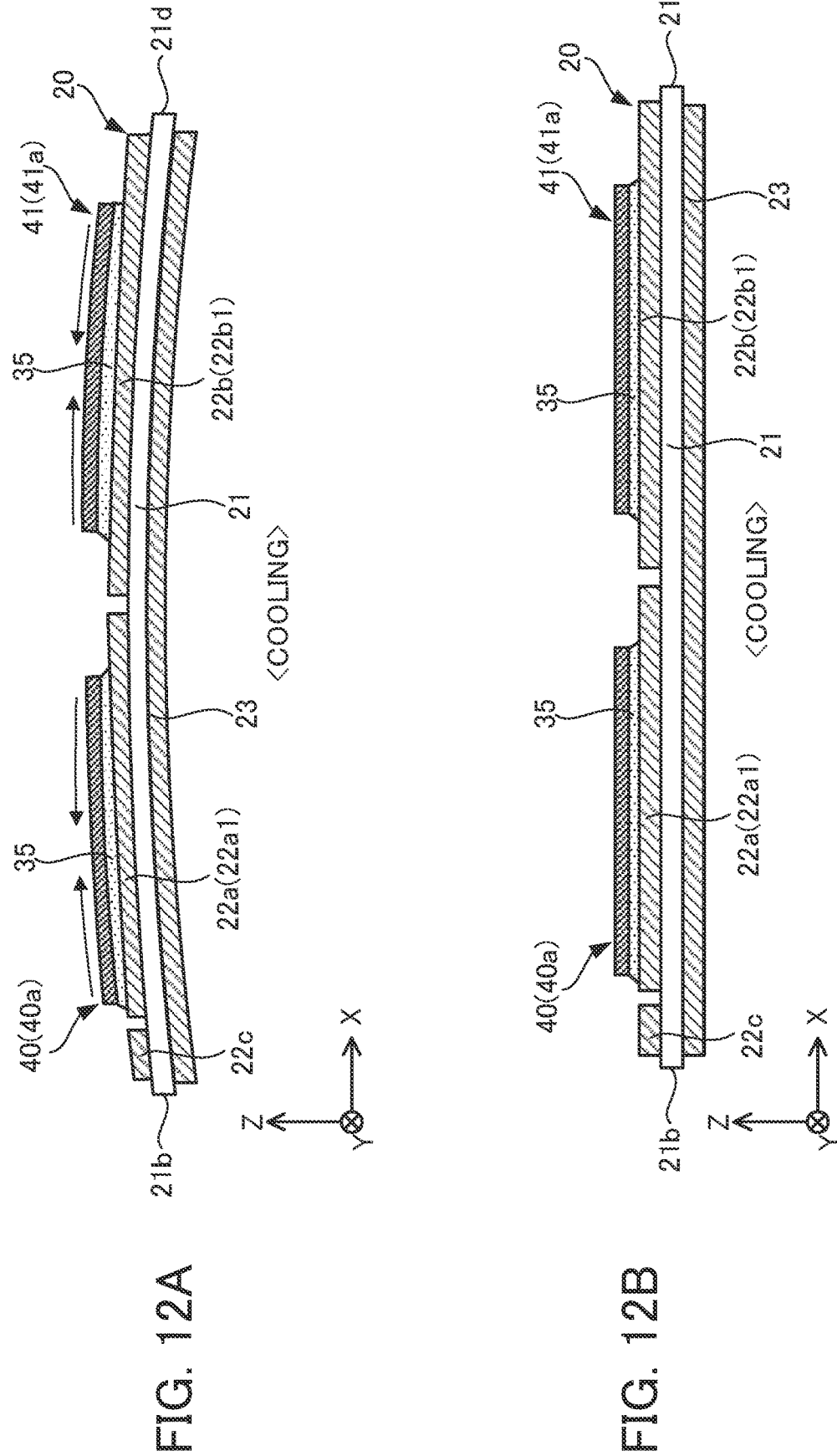
FIGS. 12A and 12B are views for describing the second bonding step (cooling time) included in the semiconductor device manufacturing method according to the embodiment.

The following describes a method of manufacturing the semiconductor device 1 including the above semiconductor unit 3 with reference to FIGS. 9, 10A, 10B, 11A to 11C, 12A, and 12B. FIG. 9 is a flowchart illustrating a semiconductor device manufacturing method according to the embodiment. FIGS. 10A and 10B are views for describing a first bonding step included in the semiconductor device manufacturing method according to the embodiment. FIGS. 11A to 11C are views for describing a second bonding step (heating time) included in the semiconductor device manufacturing method according to the embodiment. FIGS. 12A and 12B are views for describing the second bonding step (cooling time) included in the semiconductor device manufacturing method according to the embodiment. In this connection, FIGS. 10A, 10B, 11A to 11C, 12A, and 12B are side views of the insulated circuit substrate 20 as seen in the +Y direction. In addition, the illustration of the semiconductor chips 30 is omitted in FIGS. 11A to 11C, 12A, and 12B.

First, a preparation step of preparing the components of the semiconductor device 1 is executed (step S1). For example, the components of the semiconductor device 1 prepared in this step include the semiconductor chips 30, insulated circuit substrate 20, positive electrode terminal 40, negative electrode terminal 41, output terminal 42, control terminals 43*a* and 43*b*, and the row material of the sealing body 2. In addition to these components, components needed for manufacturing the semiconductor device 1 may be prepared. Also, in addition to the components, a manufacturing apparatus used in the manufacturing process may be prepared.

Then, a first bonding step of bonding the semiconductor chips 30 to the insulated circuit substrate 20 is executed (step S2). For example, the semiconductor chips 30 are disposed via the plate-shaped bonding material 35 in the chip regions 22*a*2 and 22*a*3 of the positive electrode circuit pattern layer 22*a* and the chip regions 22*c*4 and 22*c*5 of the output circuit pattern layer 22*c* in the insulated circuit substrate 20, as exemplified in FIG. 10A. Then, heating is performed to melt the plate-shaped bonding material 35, and the heating is then stopped to cool the bonding material 35. By doing so, the semiconductor chips 30 are bonded via the bonding material 35 to the chip regions 22*a*2 and 22*a*3 of the positive electrode circuit pattern layer 22*a* and the chip regions 22*c*4 and 22*c*5 of the output circuit pattern layer 22*c* in the insulated circuit substrate 20.

Through the heating and cooling, the plurality of circuit pattern layers at the front side of the insulated circuit substrate 20 and the metal plate 23 at the rear side thereof expand and contract in parallel to the plane direction. In the insulated circuit substrate 20, the volume of the metal plate 23 at the rear side is greater than that of the plurality of circuit pattern layers at the front side. Therefore, in the insulated circuit substrate 20, the amount of expansion and contraction at the rear side is greater than that at the front side. In addition, the plurality of circuit pattern layers and the metal plate 23 have different coefficients of linear expansion from that of the insulating plate 21. Therefore, after the first bonding step, the insulated circuit substrate 20 having the semiconductor chips 30 bonded thereto warps in an upward convex shape in side view seen in the ±Y directions, as illustrated in FIG. 10B. In addition, the insulated circuit substrate 20 is rectangular in plan view. The chip regions 22*a*2, 22*a*3, 22*c*4, and 22*c*5, wiring regions 22*b*2, 22*b*3, 22*c*2, and 22*c*3, control circuit pattern layers 22*d* and 22*f*, and sense circuit pattern layers 22*e* and 22*g*, which are included in the plurality of circuit pattern layers at the front side of the insulated circuit substrate 20, are formed in parallel to the center line C (and short sides 21*b* and 21*d*) (see FIG. 8). These regions and layers do not cross the center line C.

Only the terminal region 22*c*1 included in the plurality of circuit pattern layers extends in parallel to the long sides 21*a* and 21*c*, crossing the center line C. The terminal regions 22*a*1 and 22*b*1 extend in parallel to the long sides 21*a* and 21*c* but do not cross the center line C (see FIG. 8). Therefore, the insulated circuit substrate 20 greatly warps on the long sides 21*a* and 21*c* so as to be symmetrical with respect to the center line C. More specifically, the insulated circuit substrate 20 warps in such a manner that the short sides 21*b* and 21*d* are located below the center line C in side view.

Then, a second bonding step of bonding the positive electrode terminal 40, negative electrode terminal 41, and output terminal 42 to the insulated circuit substrate 20 is executed (step S3). The positive electrode terminal 40, negative electrode terminal 41, and output terminal 42 are bonded to the insulated circuit substrate 20 warping at step S2, using the bonding material 35. The following describes the case where the positive electrode terminal 40 and negative electrode terminal 41 are bonded to the insulated circuit substrate 20.

In the insulated circuit substrate 20 warping, the positive electrode bonding region 40*a* included in the positive electrode terminal 40 is placed on the plate-shaped bonding material 35 provided closer to the short side 21*b* in the attachment region Ta of the terminal region 22*a*1 included in the positive electrode circuit pattern layer 22*a*. At this time, there is a gap between the positive electrode bonding region 40a and the attachment region Ta of the terminal region 22a1 included in the positive electrode circuit pattern layer 22a on the side of the attachment region Ta closer to the short side 21d (see FIG. 11A).

Similarly, the negative electrode bonding region 41a included in the negative electrode terminal 41 is placed on the plate-shaped bonding material 35 provided closer to the short side 21d in the attachment region Tb of the terminal region 22b1 included in the negative electrode circuit pattern layer 22b. At this time, there is a gap between the negative electrode bonding region 41a and the attachment region Tb of the terminal region 22b1 included in the negative electrode circuit pattern layer 22b on the side of the attachment region Tb closer to the short side 21b (see FIG. 11A).

After the positive electrode terminal 40 and negative electrode terminal 41 are placed via the bonding material 35, heating is performed to melt the bonding material 35. Through this heating, the plurality of circuit pattern layers including the positive electrode circuit pattern layer 22a and negative electrode circuit pattern layer 22b and the metal plate 23 expand in the plane (X-Y plane) direction. As described earlier, the volume of the metal plate 23 is greater than that of the plurality of circuit pattern layers, and therefore, the amount of expansion in the metal plate 23 is greater than that in the plurality of circuit pattern layers. Thus, the insulated circuit substrate 20 becomes approximately flat (see FIG. 11B). The heating continues at the same or a higher temperature, so that the molten bonding material 35 spreads over the entire attachment regions Ta and Tb of the terminal regions 22a1 and 22b1 included in the positive electrode circuit pattern layer 22a and negative electrode circuit pattern layer 22b. Thus, the bonding material 35 fills the gap between the positive electrode bonding region 40a included in the positive electrode terminal 40 and the attachment region Ta of the terminal region 22a1 and the gap between the negative electrode bonding region 41a included in the negative electrode terminal 41 and the attachment region Tb of the terminal region 22b1 (see FIG. 11C).

The molten bonding material 35 is then cooled. Thereby, the positive electrode bonding region 40a included in the positive electrode terminal 40 and the negative electrode bonding region 41a included in the negative electrode terminal 41 are bonded via the bonding material 35 to the attachment regions Ta and Tb of the terminal regions 22a1 and 22b1, respectively. In addition, when cooled, the insulated circuit substrate 20 warps in an upward convex again due to the residual stress. Note that the thicknesses of the positive electrode bonding region 40a included in the positive electrode terminal 40 and the negative electrode bonding region 41a included in the negative electrode terminal 41 are less than the thicknesses of the positive electrode circuit pattern layer 22a and negative electrode circuit pattern layer 22b. That is, the rigidity of the positive electrode bonding region 40a included in the positive electrode terminal 40 and the negative electrode bonding region 41a included in the negative electrode terminal 41 is less than a predetermined value. Therefore, the positive electrode bonding region 40a included in the positive electrode terminal 40 and the negative electrode bonding region 41a included in the negative electrode terminal 41 are able to follow this warping. Thus, the positive electrode bonding region 40a and negative electrode bonding region 41a, which are bonded to the insulated circuit substrate 20, warp as well (see FIG. 12A).

The cooling continues at the same or a lower temperature, so that the positive electrode bonding region 40a included in the positive electrode terminal 40 and the negative electrode bonding region 41a included in the negative electrode terminal 41 contract. At this time, the positive electrode bonding region 40a and the negative electrode bonding region 41a are bonded to the terminal regions 22a1 and 22b1 included in the positive electrode circuit pattern layer 22a and negative electrode circuit pattern layer 22b, respectively. That is, the insulated circuit substrate 20 is restrained to the positive electrode bonding region 40a and the negative electrode bonding region 41a. Thereby, the insulated circuit substrate 20 warping in an upward convex is corrected to be level according to the contraction of the positive electrode bonding region 40a and negative electrode bonding region 41a (see FIG. 12B). By reducing the warpage of the insulated circuit substrate 20 in this manner, it becomes possible to manufacture the semiconductor device 1 satisfying manufacturing specifications.

Note that the restraining force depends on the widths la and lb in the ±X directions of the positive electrode bonding region 40a and negative electrode bonding region 41a. If the widths la and lb are too small, then the restraining force is insufficient. To obtain the restraining force that is enough to make the insulated circuit substrate 20 level, the widths la and lb of the positive electrode bonding region 40a and negative electrode bonding region 41a need to be greater than half (50%) the widths La and Lb of the terminal regions 22a1 and 22b1 included in the positive electrode circuit pattern layer 22a and negative electrode circuit pattern layer 22b.

For example, in the case where the widths la and lb are 50% the widths La and Lb, the warpage of the insulated circuit substrate 20 is reduced by 60% from the warpage (see FIG. 10B, for example) of the insulated circuit substrate 20 warping in an upward convex to which the positive electrode terminal 40 and negative electrode terminal 41 are not bonded. That is to say, the warpage of the insulated circuit substrate 20 in this case is 40% that of the insulated circuit substrate 20 warping in the upward convex shape.

To further reduce the warpage, the widths la and lb need to be greater than or equal to 56% the widths La and Lb. For example, in the case where the widths la and lb are 56% the widths La and Lb, the warpage of the insulated circuit substrate 20 is reduced by 60% or more from the warpage of the insulated circuit substrate 20 warping in the upward convex to which the positive electrode terminal 40 and negative electrode terminal 41 are not bonded. That is to say, the warpage of the insulated circuit substrate 20 in this case is 40% or less that of the insulated circuit substrate 20 warping in the upward convex shape.

As described above, as the widths la and lb of the positive electrode bonding region 40a included in the positive electrode terminal 40 and the negative electrode bonding region 41a included in the negative electrode terminal 41 approach the widths La and Lb of the terminal regions 22a1 and 22b1 included in the positive electrode circuit pattern layer 22a and negative electrode circuit pattern layer 22b, the warpage of the insulated circuit substrate 20 having bonded thereto the positive electrode terminal 40 and negative electrode terminal 41 is corrected to be more level.

In addition, the output bonding region 42a of the output terminal 42 is bonded to the attachment region Tc of the terminal region 22c1 included in the output circuit pattern layer 22c using the bonding material 35. In this connection, the width in the ±X directions of the output bonding region 42a of the output terminal 42 is sufficiently smaller than the widths la and lb. Therefore, the output bonding region 42a of the output terminal 42 is bonded to the attachment region Tc of the output circuit pattern layer 22c, irrespective of the warpage of the insulated circuit substrate 20.

Then, a wiring step of wiring between the semiconductor chips 30 and the insulated circuit substrate 20 using various wires is executed (step S4). The control electrode 31 of each semiconductor chip 30 and the control circuit pattern layer 22d are directly connected to each other with the control wires 36 (on the –X side in FIG. 5). In addition, the control electrode 31 of each semiconductor chip 30 and the control circuit pattern layer 22f are directly connected to each other with the control wires 36 (on the +X side in FIG. 5).

The output electrode of each semiconductor chip 30 and the sense circuit pattern layer 22e are directly connected to each other with the sense wires 37 (on the –X side in FIG. 5). The output electrode of each semiconductor chip 30 and the sense circuit pattern layer 22g are directly connected to each other with the sense wires 37 (on the +X side in FIG. 5).

The output electrode of each semiconductor chip 30 and the wiring region 22c2 or 22c3 of the output circuit pattern layer 22c are directly connected to each other with the main current wires 38 (on the –X side in FIG. 5). The output electrode of each semiconductor chip 30 and the wiring region 22b2 or 22b3 of the negative electrode circuit pattern layer 22b are directly connected to each other with the main current wires 38 (on the +X side in FIG. 5).

In addition, the control terminals 43a are bonded to the control circuit pattern layer 22d and sense circuit pattern layer 22e using the bonding material 35 (not illustrated). The control terminals 43b are bonded to the control circuit pattern layer 22f and sense circuit pattern layer 22g using the bonding material 35 (not illustrated). With the above process, the semiconductor unit 3 is obtained.

Then, a sealing step of sealing the semiconductor unit 3 with a sealing member is executed (step S5). The semiconductor unit 3 is set in a predetermined mold, and then the sealing material is applied to fill the mold and is then cured. After the mold is removed, the semiconductor device 1 in which the semiconductor unit 3 is sealed with the sealing body 2 as illustrated in FIG. 1 is obtained.

The following describes a reference example of the semiconductor unit 3 included in the semiconductor device 1. The thicknesses of the positive electrode terminal 40 and negative electrode terminal 41 in the semiconductor unit 3 according to the reference example are greater than the thicknesses of the positive electrode circuit pattern layer 22a and negative electrode circuit pattern layer 22b of the insulated circuit substrate 20. Here, as an example, the case will be described in which the thicknesses of the positive electrode terminal 40 and negative electrode terminal 41 are approximately 1.7 times the thicknesses of the positive electrode circuit pattern layer 22a and negative electrode circuit pattern layer 22b of the insulated circuit substrate 20.

Figures 13A, 13B, 13C:
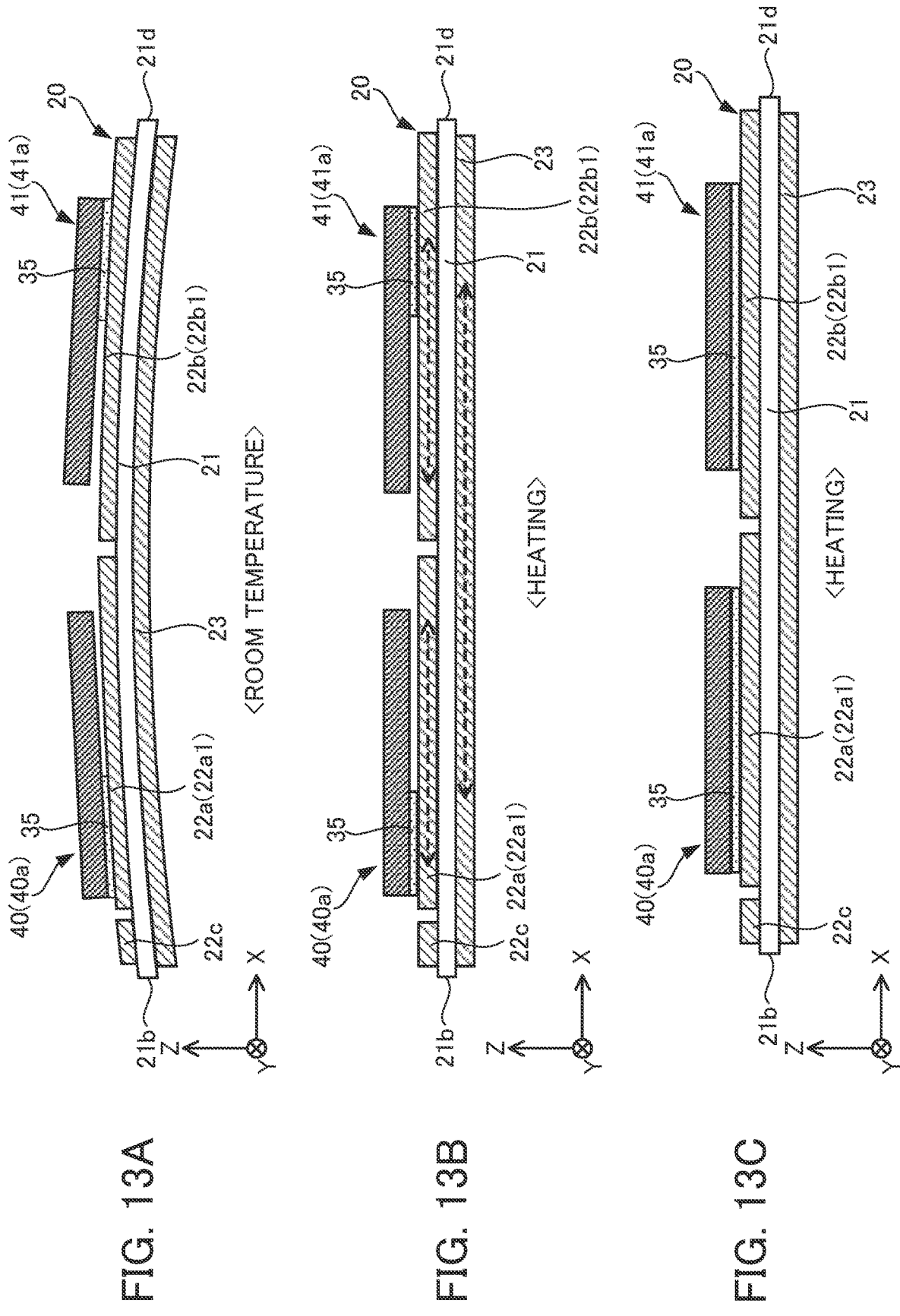
FIGS. 13A to 13C are views for describing a second bonding step (heating time) included in a semiconductor device manufacturing method according to a reference example.
Figures 14A, 14B:
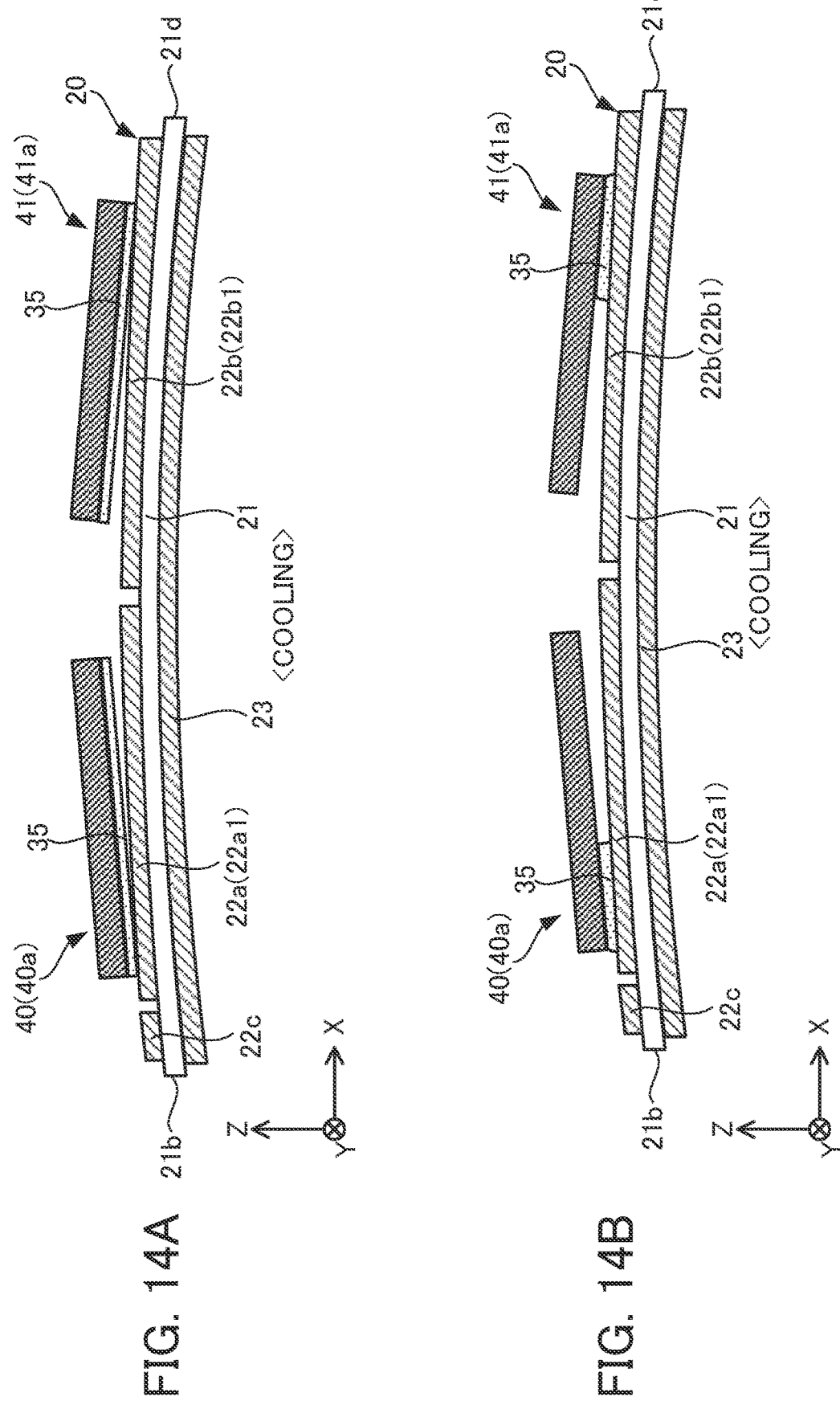
FIGS. 14A and 14B are views for describing the second bonding step (cooling time) included in the semiconductor device manufacturing method according to the reference example.

The semiconductor device 1 including this semiconductor unit 3 as well may be manufactured in accordance with the flowchart of FIG. 9. Here, the second bonding step S3 will be described with reference to FIGS. 13A to 13C, 14A, and 14B. FIGS. 13A to 13C are views for describing the second bonding step (heating time) included in the semiconductor device manufacturing method according to the reference example. FIGS. 14A and 14B are views for describing the second bonding step (cooling time) included in the semiconductor device manufacturing method according to the reference example. In this connection, FIGS. 13A to 13C, 14A, and 14B correspond to FIGS. 11A to 11C, 12A, and 12B.

For the semiconductor device 1 according to the reference example as well, the preparation step (step S1) and first bonding step (step S2) of the flowchart of FIG. 9 are executed and then the second bonding step is executed (step S3). As described earlier, the insulated circuit substrate 20 having the semiconductor chips 30 bonded thereto warps in an upward convex shape through the first bonding step. The positive electrode terminal 40, negative electrode terminal 41, and output terminal 42 are bonded to this insulated circuit substrate 20 using the bonding material 35. Here, once again, the case will be described in which the positive electrode terminal 40 and negative electrode terminal 41 are bonded to the insulated circuit substrate 20.

In the insulated circuit substrate 20 warping, the positive electrode bonding region 40a of the positive electrode terminal 40 and the negative electrode bonding region 41a of the negative electrode terminal 41 are placed via the plate-shaped bonding material 35 in the terminal regions 22a1 and 22b1 included in the positive electrode circuit pattern layer 22a and negative electrode circuit pattern layer 22b, respectively, as illustrated in FIG. 13A. At this time, there is a gap between the positive electrode bonding region 40a and the terminal region 22a1 included in the positive electrode circuit pattern layer 22a on the side of the terminal region 22a1 closer to the short side 21d. In addition, there is a gap between the negative electrode bonding region 41a and the terminal region 22b1 included in the negative electrode circuit pattern layer 22b on the side of the terminal region 22b1 closer to the short side 21b.

After the positive electrode terminal 40 and negative electrode terminal 41 are placed via the bonding material 35 as described above, heating is performed to melt the bonding material 35. Through this heating, the insulated circuit substrate 20 becomes approximately flat (see FIG. 13B), as in the case of FIG. 11B. The heating continues at the same or a higher temperature, so that the molten bonding material 35 spreads so as to fill the gap between the positive electrode bonding region 40a included in the positive electrode terminal 40 and the terminal region 22a1 and the gap between the negative electrode bonding region 41a included in the negative electrode terminal 41 and the terminal region 22b1 (see FIG. 13C), as in the case of FIG. 11C.

The molten bonding material 35 is then cooled. By doing so, the positive electrode bonding region 40a included in the positive electrode terminal 40 and the negative electrode bonding region 41a included in the negative electrode terminal 41 are bonded respectively to the attachment regions Ta and Tb of the terminal regions 22a1 and 22b1 via the bonding material 35.

In addition, when cooled, the insulated circuit substrate 20 warps in an upward convex shape again due to the residual stress, as described earlier. In this reference example, the thicknesses of the positive electrode bonding region 40a and negative electrode bonding region 41a are greater than the thicknesses of the positive electrode circuit pattern layer 22a and negative electrode circuit pattern layer 22b. Therefore, the rigidity of the positive electrode bonding region 40a and negative electrode bonding region 41a is higher than the case described above in the embodiment. Therefore, the positive electrode bonding region 40a and negative electrode bonding region 41a are not able to follow the warpage, but are kept in a flat plate shape without warping. Thus, the positive electrode bonding region 40a and negative electrode bonding region 41a are inclined with respect to the insulated circuit substrate 20. That is, a gap is generated between each of the positive electrode bonding region 40a and negative electrode bonding region 41*a* and the front surface of the insulated circuit substrate 20 warping (see FIG. 14A).

When the cooling further continues at the same or a lower temperature, the positive electrode bonding region 40*a* is bonded to the terminal region 22*a*1 of the positive electrode circuit pattern layer 22*a* on the side of the terminal region 22*a*1 closer to the short side 21*b* via the bonding material 35, and the negative electrode bonding region 41*a* is bonded to the terminal region 22*b*1 of the negative electrode circuit pattern layer 22*b* on the side of the terminal region 22*b*1 closer to the short side 21*d* via the bonding material 35. That is, the bonding areas where the positive electrode circuit pattern layer 22*a* and negative electrode circuit pattern layer 22*b* of the positive electrode bonding region 40*a* and negative electrode bonding region 41*a* are bonded to the terminal regions 22*a*1 and 22*b*1 are smaller than the case described above in the embodiment. Therefore, the restraining force of the positive electrode bonding region 40*a* and negative electrode bonding region 41*a* to the terminal regions 22*a*1 and 22*b*1 of the positive electrode circuit pattern layer 22*a* and negative electrode circuit pattern layer 22*b* is lower than the case described above in the embodiment, so that the insulated circuit substrate 20 is kept in the upward convex shape (see FIG. 14B).

After that, the wiring step (step S4) and sealing step (step S5) are executed in order on the above insulated circuit substrate 20. In the wiring step, the wiring of the insulated circuit substrate 20 warping is performed with various wires. However, since the insulated circuit substrate 20 warps in the upward convex shape, the various wires may fail to be bonded to predetermined positions reliably. Wires, even if bonded to the predetermined positions, may be separated from the bonding positions. The separation of the wires would cause a failure in the semiconductor device 1.

In addition, in the sealing step, the positive electrode terminal 40 and negative electrode terminal 41 each having a gap from (being inclined with respect to) the insulated circuit substrate 20 warping prevent the insulated circuit substrate 20 from being set in the predetermined mold properly. Even if the insulated circuit substrate 20 is set in the mold, the sealing material applied to the inside of the mold covers the curved rear side of the insulated circuit substrate 20 since the insulated circuit substrate 20 warps in the upward convex shape. In this case, the metal plate 23 of the insulated circuit substrate 20 is not exposed from the bottom surface 2*f* of the sealing body 2, unlike the case of FIG. 4. The semiconductor device 1 including this sealing body 2 may have a lower heat dissipation property. In this connection, this case needs another step of somewhat shaving the bottom surface 2*f* of the sealing body 2. That is, there increases the number of steps in the semiconductor device manufacturing process, and the shavings of the sealing body 2 is a waste. In addition, there is a concern that the size of the semiconductor device 1 manufactured in this manner may fail to satisfy the predetermined manufacturing specifications. Furthermore, this case increases the manufacturing cost.

The above-described semiconductor device 1 that is an example of an electronic device includes the insulated circuit substrate 20, positive electrode terminal 40, and negative electrode terminal 41. The insulated circuit substrate 20 is rectangular in plan view, and includes the insulating plate 21 having the front surface and the rear surface opposite to the front surface, the positive electrode circuit pattern layer 22*a* and negative electrode circuit pattern layer 22*b* formed on the front surface of the insulating plate 21, and the metal plate 23 formed on the rear surface of the insulating plate 21. The positive electrode circuit pattern layer 22*a* and the negative electrode circuit pattern layer 22*b* respectively have the terminal regions 22*a*1 and 22*b*1 that extend in parallel to the long-side direction of the front surface of the insulating plate 21. The thicknesses of the positive electrode bonding region 40*a* of the positive electrode terminal 40 and the negative electrode bonding region 41*a* of the negative electrode terminal 41 are less than the thicknesses of the terminal regions 22*a*1 and 22*b*1 of the positive electrode circuit pattern layer 22*a* and negative electrode circuit pattern layer 22*b*. The lengths la and lb in the long-side direction of the positive electrode bonding region 40*a* of the positive electrode terminal 40 and the negative electrode bonding region 41*a* of the negative electrode terminal 41 are greater than or equal to half the lengths La and Lb in the long-side direction of the terminal regions 22*a*1 and 22*b*1 of the positive electrode circuit pattern layer 22*a* and negative electrode circuit pattern layer 22*b*.

In this semiconductor device 1, the insulated circuit substrate 20 is approximately flat. Therefore, when the sealing body 2 is used for sealing, the metal plate 23 of the insulated circuit substrate 20 may be exposed from the bottom surface 2*f* of the sealing body 2 so that the bottom surface 2*f* of the sealing body 2 is flush with the metal plate 23 of the insulated circuit substrate 20. This prevents a reduction in the heat dissipation property of the semiconductor device 1. Since the metal plate 23 of the insulated circuit substrate 20 is exposed, there is no need to shave the bottom surface 2*f* of the sealing body 2. That is, the shaving step is not needed. This prevents the production of a waste in the sealing member due to the shaving of the sealing body 2 and also prevents an increase in the manufacturing cost. In addition, since the insulated circuit substrate 20 is flat, the various wires are bonded reliably so as not to be separated. In addition, the semiconductor device 1 is sealed by the sealing body 2 in a size satisfying desired manufacturing specifications. Therefore, in the semiconductor device 1, it is possible to prevent deformation of the insulated circuit substrate 20 and also prevent relative misalignment between the insulated circuit substrate 20 and each of the positive electrode terminal 40 and negative electrode terminal 41 bonded to the insulated circuit substrate 20 using the bonding material 35. As a result, the semiconductor device 1 is able to prevent a reduction in the heat dissipation property and a reduction in the reliability, and is manufactured such as to satisfy manufacturing specifications regarding the size, performance, and others.

In the semiconductor device 1 of the present embodiment, the positive electrode terminal 40 and negative electrode terminal 41 are bonded respectively to the terminal regions 22*a*1 and 22*b*1 of the positive electrode circuit pattern layer 22*a* and negative electrode circuit pattern layer 22*b* facing the long side 21*a* of the insulating plate 21. Alternatively, for example, in the case where the terminal regions 22*a*1 and 22*b*1 of the positive electrode circuit pattern layer 22*a* and negative electrode circuit pattern layer 22*b* are provided in parallel to the long sides 21*a* and 21*c* further inside the insulating plate 21, the positive electrode terminal 40 and negative electrode terminal 41 may be formed in the terminal regions 22*a*1 and 22*b*1 provided further inside the insulating plate 21. This case as well provides the same effects as the semiconductor device 1.

Figure 15:
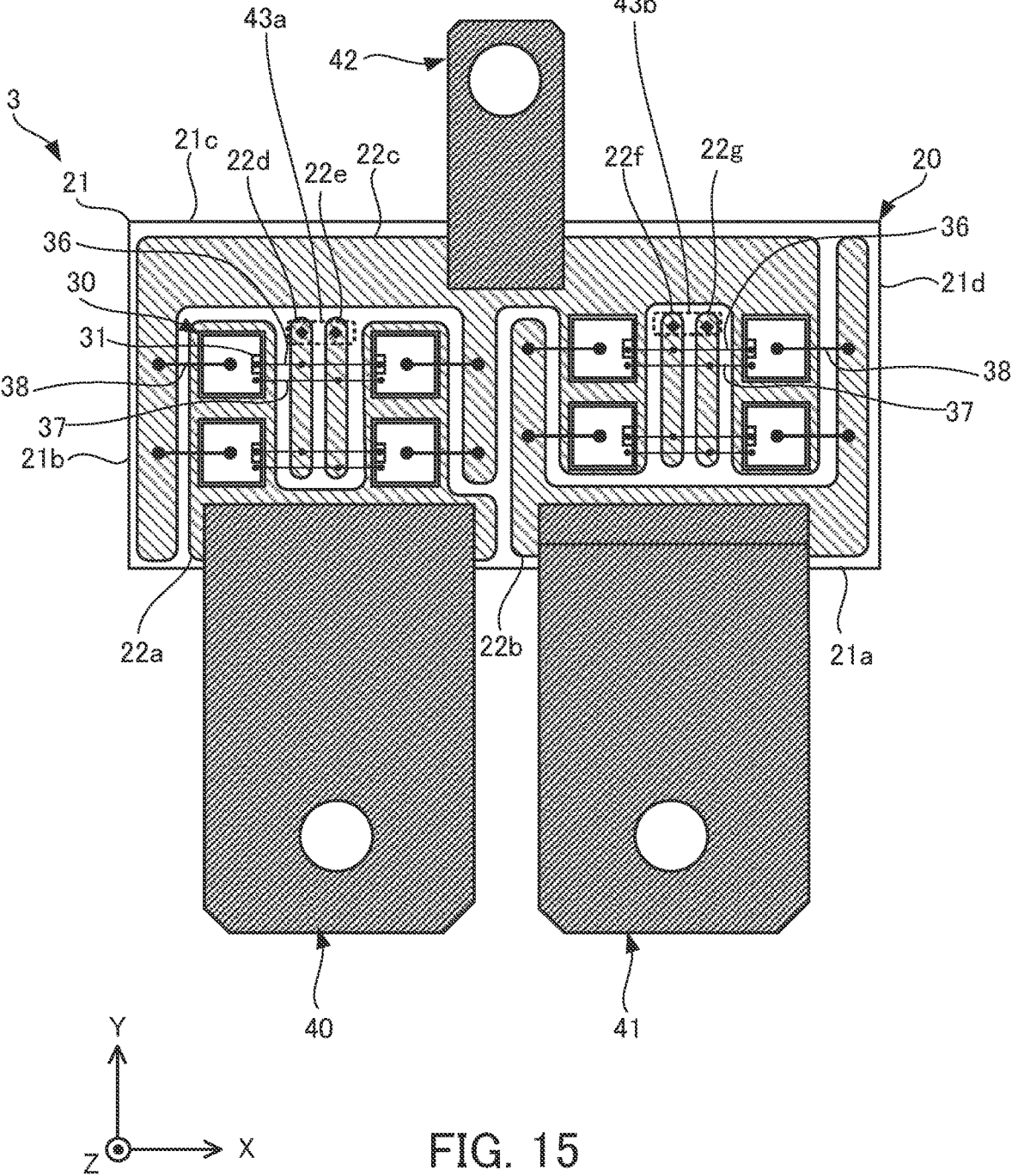
FIG. 15 is a plan view of a semiconductor unit included in the semiconductor device according to the embodiment (variation).

The following describes another example (variation) for the arrangement of the semiconductor chips 30 of the semiconductor device 1 with reference to FIG. 15. FIG. 15 is a plan view of a semiconductor unit included in the semiconductor device according to the embodiment (variation).

The semiconductor unit 3 illustrated in FIG. 15 is obtained by modifying the semiconductor unit 3 of FIG. 5 as follows. The semiconductor chips 30 disposed in the chip regions 22a2 and 22a3 of the positive electrode circuit pattern layer 22a are arranged such that their control electrodes 31 face inward (closer to the control circuit pattern layer 22d and sense circuit pattern layer 22e) so as to face each other.

Because of this arrangement, as seen in the left part of FIG. 15, the control wires 36 each extend in parallel to the long sides 21a and 21c to connect the control electrodes 31 of facing semiconductor chips 30 to the control circuit pattern layer 22d. In addition, the sense wires 37 each extend in parallel to the long sides 21a and 21c to connect the output electrodes of facing semiconductor chips 30 to the sense circuit pattern layer 22e.

On the other hand, the semiconductor chips 30 disposed in the chip regions 22c4 and 22c5 of the output circuit pattern layer 22c are arranged such that their control electrodes 31 face inward (closer to the control circuit pattern layer 22f and sense circuit pattern layer 22g) so as to face each other.

Because of this arrangement, as seen in the right part of FIG. 15, the control wires 36 each extend in parallel to the long sides 21a and 21c to connect the control electrodes 31 of facing semiconductor chips 30 to the control circuit pattern layer 22f. In addition, the sense wires 37 each extend in parallel to the long sides 21a and 21c to connect the output electrodes of facing semiconductor chips 30 to the sense circuit pattern layer 22g.

The control terminals 43a are bonded to the end portions of the control circuit pattern layer 22d and sense circuit pattern layer 22e closer to the long side 21c. The control terminals 43b are bonded to the end portions of the control circuit pattern layer 22f and sense circuit pattern layer 22g closer to the long side 21c. This semiconductor device 1 as well is able to prevent deformation of the insulated circuit substrate 20 and also prevent relative misalignment between the insulated circuit substrate 20 and each of the positive electrode terminal 40 and negative electrode terminal 41 bonded to the insulated circuit substrate 20 using the bonding material 35. As a result, the semiconductor device 1 is able to prevent a reduction in the heat dissipation property and a reduction in the reliability, and is manufactured such as to satisfy manufacturing specifications regarding the size, performance, and others.

The disclosed technique makes it possible to prevent deformation of the substrate in an electronic device and also prevent relative misalignment between the substrate and each terminal bonded to the substrate using a bonding material.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. An electronic device, comprising:
   a substrate being rectangular in a plan view of the electronic device, the substrate including
   an insulating plate having a front surface and a rear surface opposite to the front surface, and having two long sides in a long-side direction of the substrate,
   a first circuit pattern layer provided on the front surface of the insulating plate, and
   a metal plate provided on the rear surface of the insulating plate, the first circuit pattern layer having a first terminal region extending in the long-side direction of the substrate; and
   a first terminal having a first bonding region bonded to the first terminal region of the first circuit pattern layer via a first bonding material, the first terminal extending in a short-side direction of the substrate outward from one of the two long sides of the insulating plate, the first bonding region extending in the long-side direction of the substrate, wherein
   in the plan view, each of the first terminal region and the first bonding region is rectangular, and has a pair of long sides that extend parallel to the long-side direction of the substrate,
   a thickness of the first bonding region of the first terminal is less than a thickness of the first terminal region of the first circuit pattern layer, and
   in the long-side direction of the substrate, a length of the first bonding region of the first terminal is greater than or equal to half a length of the first terminal region of the first circuit pattern layer.

2. The electronic device according to claim 1, wherein the first terminal region of the first circuit pattern layer is disposed adjacent to the one of the two long sides of the insulating plate.

3. The electronic device according to claim 2, wherein a total thickness of the first terminal region of the first circuit pattern layer and the first bonding region of the first terminal is greater than a thickness of the metal plate.

4. The electronic device according to claim 2, wherein
   the substrate further includes a second circuit pattern layer provided on the front surface of the insulating plate,
   the second circuit pattern layer has a second terminal region extending in the long-side direction of the substrate, the second terminal region being located adjacent in the long-side direction of the substrate to the first terminal region of the first circuit pattern layer, and
   the electronic device further includes a second terminal having a second bonding region bonded to the second terminal region of the second circuit pattern layer via a second bonding material, the second terminal region extending in the long-side direction of the substrate.

5. The electronic device according to claim 4, wherein the second terminal region of the second circuit pattern layer is disposed adjacent to the one of the two long sides of the insulating plate.

6. The electronic device according to claim 5, wherein one end of the first terminal region of the first circuit pattern layer and one end the second terminal region of the second circuit pattern layer that face each other in the long-side direction of the substrate are located at the same distance from a center line that is parallel to the short-side direction of the substrate and passes through a center of the substrate in the long-side direction of the substrate.

7. The electronic device according to claim 6, wherein in the short-side direction of the substrate, a width of the first terminal region of the first circuit pattern layer is approximately equal to a width of the second terminal region of the second circuit pattern layer.

8. The electronic device according to claim 7, wherein the first circuit pattern layer further has two portions respectively extending in the short-side direction of the substrate from the first terminal region toward the other of the two long sides, and the second circuit pattern layer further has two portions respectively extending in the short-side direction of the substrate from the second terminal region toward the other of the two long sides of the insulating plate in the plan view.

9. The electronic device according to claim 8, wherein the first bonding region of the first terminal and the second bonding region of the second terminal each have a flat plate shape.

10. The electronic device according to claim 9, wherein the first terminal including the first bonding region has a flat plate shape as a whole.

11. An electronic device manufacturing method, comprising:

preparing a substrate being rectangular in a plan view of an electronic device and a first terminal having a first bonding region, the substrate including an insulating plate having a front surface and a rear surface opposite to the front surface and having two long sides in a long-side direction of the substrate, a first circuit pattern layer provided on the front surface of the insulating plate, and a metal plate provided on the rear surface of the insulating plate, the first circuit pattern layer having a first terminal region extending in a long-side direction of the substrate; and bonding the first bonding region of the first terminal to the first terminal region of the first circuit pattern layer via a first bonding material such that the first terminal extends in a short-side direction of the substrate outward from one of the two long sides of the insulating plate, wherein in the plan view, each of the first terminal region and the first bonding region is rectangular, and has a pair of long sides that extend parallel to the long-side direction of the substrate, a thickness of the first bonding region of the first terminal is less than a thickness of the first terminal region of the first circuit pattern layer, and in the long-side direction of the substrate, a length of the first bonding region of the first terminal is greater than or equal to half a length of the first terminal region of the first circuit pattern layer.

\* \* \* \* \*